United States Patent [19]
Kilby et al.

[11] 3,979,757
[45] Sept. 7, 1976

[54] ELECTROSTATIC DISPLAY SYSTEM WITH TONER APPLIED TO HEAD

[76] Inventors: Jack S. Kilby, 7723 Midbury, Dallas, Tex. 75230; Jay W. Lathrop, 211 Lark Circle, Clemson, S.C. 29631

[22] Filed: Jan. 15, 1975

[21] Appl. No.: 541,239

Related U.S. Application Data

[62] Division of Ser. No. 352,729, April 19, 1973, abandoned.

[52] U.S. Cl. .............................. 346/74 ES; 178/30; 346/74 EW
[51] Int. Cl.² ................. G03G 15/08; G03G 15/04
[58] Field of Search ...... 346/74 ES, 74 EH, 74 EW, 346/74 SB, 74 S, 74 SC; 178/30, 6.6 A; 340/173 LS, 173 CR, 173 R; 101/DIG. 13, 426

[56] References Cited
UNITED STATES PATENTS

| | | | |
|---|---|---|---|
| 2,586,047 | 2/1952 | Huebner | 101/DIG. 13 |
| 3,160,091 | 12/1964 | Schwertz | 101/DIG. 13 |
| 3,184,749 | 5/1965 | Groth | 346/74 EW |
| 3,186,839 | 6/1965 | Stone | 101/DIG. 13 |
| 3,289,209 | 11/1966 | Schwertz | 101/DIG. 13 |
| 3,329,962 | 7/1967 | Cola | 346/74 EH |
| 3,526,704 | 9/1970 | Heller | 101/DIG. 13 |
| 3,611,419 | 10/1971 | Blumenthal | 346/74 EH |
| 3,786,745 | 1/1974 | Hinz | 101/DIG. 13 |

*Primary Examiner*—Bernard Konick
*Assistant Examiner*—Jay P. Lucas
*Attorney, Agent, or Firm*—Richards, Harris and Medlock

[57] ABSTRACT

An electrostatic imaging system is disclosed having an imaging head characterized by a plurality of discretely chargeable areas. The charge on each discrete area is controlled by a separate binary circuit. The imaging head is preferably a monocrystalline semiconductor substrate with the discretely chargeable areas being either metallized plates or regions of one conductivity type that are individually isolated by regions of the other conductivity type. The binary circuit associated with each chargeable area is formed in the semiconductor substrate using conventional integrated circuit technology. One embodiment of the imaging head is used in an electrostatic line printer programmed by the output from a digital system to produce matrix type characters. Another embodiment of the imaging head may also be used in an electrostatic half tone facsimile system.

Still another embodiment of the imaging head is used in electrostatic systems for producing high quality characters in high or low speed electrostatic systems which are geometrically programmed using light coupling, capacitive coupling, or resistive coupling to the imaging head. The imaging heads may also be used in temporary display systems in which visible particles are attracted to selectively activated, separated by chargeable areas each controlled by a programmable bistable circuit.

48 Claims, 33 Drawing Figures

ELECTROSTATIC DISPLAY SYSTEM WITH TONER APPLIED TO HEAD

This is a division of application Ser. No. 352,729, filed Apr. 19, 1973, now abandoned.

This invention relates generally to display systems, and more particularly to systems for producing either permanent or temporary visible images using electrostatically charged areas for attracting charged particles.

There are many applications where it is necessary to produce a visual display of information from an electronic signal. For example, it is often desirable to produce an alphanumeric record or graph from the electronic signals output from a computer. It is also often desirable to transmit photographs or printed material to remote locations using binary data. Temporary displays for alphanumeric characters such as liquid crystals, light emitting diodes, and nixie tubes are used extensively as read out for digital systems.

A number of line printers have been developed as computer outputs. However, these systems are generally characterized by the fact that relatively low level electronic signals must be converted to very high voltages or to another form of energy such as mechanical or thermal. Such conversions are expensive, both in economic terms and in terms of the energy required. Electrostatic printing, such as the XEROX and the RCA ELECTROFAX processes, are electrophotographic processes and cannot in general be operated directly from the electronic signals produced by a binary system. Additionally, these electrophotographic processes require relatively high voltages, typically several hundreds of volts, in the electrostatic printing processes.

The present invention provides an electrostatic display system, an specifically a printing system which can be operated directly from low voltage binary signals to produce matrix type characters, high resolution facsimiles, half tone facsimiles, and high resolution characters from a selected font in either an inexpensive line printer or a high speed line printer.

In accordance with the present invention, an array of discretely chargeable areas are formed on an imaging head. The charge on each of the discrete areas is controlled by a separate bistable circuit. Each bistable circuit can be set to either of its states by an electronic signal received from a digital system, from light energy striking a sensor spatially associated with the respective discrete chargeable area, or by an electronic signal coupled, either capacitively or directly, through the discretely chargeable area.

The discretely chargeable area may be of any conductive material. In a preferred embodiment, the chargeable areas are metallized plates. In another embodiment, the chargeable areas are regions of one conductivity type in a semiconductor substrate isolated by regions of the other conductivity type. In still another preferred embodiment, the separately chargeable areas are formed on a monocrystalline semiconductor substrate carrying the bistable circuits in integrated circuit form.

In one specific embodiment of the invention, the imaging heads is in the form of a line printer having a plurality of horizontal rows of discretely chargeable areas. The binary circuits controlling the discretely chargeable areas in each row are connected to form the successive stages of parallel shift registers, the number of stages in each shift register corresponding to the number of chargeable areas in each row. A set of electronic signals representing an alphanumeric character is converted to signals representing a 7 × 5 matrix presentation of the character. The signals representing the successive columns of the successive matrix characters are then serially loaded into the shift registers until the matrix data representing the full line of characters is loaded into the print head. Electrically charged particles of resin coated pigment ("Toner") are then brushed over the head to develop the electrostatic image. Because of their electrical charge, particles are attracted to oppositely charged areas of the head, forming an image. This particle image is then transferred to ordinary paper and fixed to provide a permanent line of characters.

In another specific embodiment of the invention, the discretely chargeable areas on the imaging head are arranged as a line of dots to provide a facsimile system. In a preferred embodiment, each dot has a plurality of discretely chargeable areas. The discrete areas of each dot are in the binary progression 1:2:4 so that eight shades of gray can be produced by selectively charging the discrete areas of each dot in a predetermined relationship. The bistable circuits controlling each discretely chargeable area are connected again as one or more shift registers and serial binary facsimile dots stored in the shift register to determine the electrostatic charge state of the respective discrete areas. The charged areas may then be used to attract particles having the opposite electrostatic charge to develop the latent electrostatic image. The particle image is then transferred to paper and fixed in the conventional manner. The result is a reproduction of the facsimile image either in black and white, or half tones with a significant number of shades of gray.

In another embodiment of the invention, a large number of very small, discretely chargeable areas, each controlled by a bistable circuit, are formed on a head in a very dense array. Each bistable circuit may be set to one stable state by an electronic signal and to the other stable state by exposing a light sensitive device disposed adjacent the discretely chargeable area to light. The image of a character would typically cover a very large number of the discretely chargeable areas to provide a more pleasing character of good resolution than can be obtained in a simple matrix character. Developing and printing is then accomplished as heretofore described. The character images may be projected onto the array from a font manipulated by a suitable mechanism. Or any image may be reproduced from a precomposed sheet, including pictorial materials.

In another embodiment of the invention, a highly dense array of discretely chargeable areas are provided and the charge on each area is controlled by a bistable circuit. The bistable circuits are programmed by capacitively coupling a signal through the respective discretely chargeable elements to the circuit. This is achieved by a font of conductive alphanumeric characters. When the desired character of font is positioned at the desired location on the array in response to the electronic signals, a voltage pulse is applied to the character and is capacitively coupled through the adjacent discretely chargeable areas to set the respective bistable circuits to the desired state. Alternatively, the electronic signal can be resistively coupled to the discretely chargeable areas by a resistive material, such as conventional xerographic toner, disposed between the conductive character of the font and chargeable areas.

This invention also contemplates a number of systems for programming the imaging heads to produce the latent electrostatic images, for developing the images, and for transferring or printing the images on a sheet of ordinary paper. These systems include one in which the imaging head is held stationary and first the developing particles then the paper are brought to the imaging head. In another embodiment the imaging head is successively moved to a programming station, a developing station, and a transfer station. When located at the transfer station a character font may be manipulated relative to the head, or the head may be moved past the font. This invention also contemplates various data handling techniques for programming the various imaging heads in the various systems.

In accordance with other aspects of the invention, the imaging heads may be used to temporarily attract material which is visible to provide a temporary image held until the bistable circuits are reset.

The novel features believed characteristic of this invention are set forth in the appended claims. This invention itself, however, as well as other objects and advantages thereof, may best be understood by reference to the following detailed description of illustrated embodiments, read in conjunction with the accompanying drawings:

Figure 1:
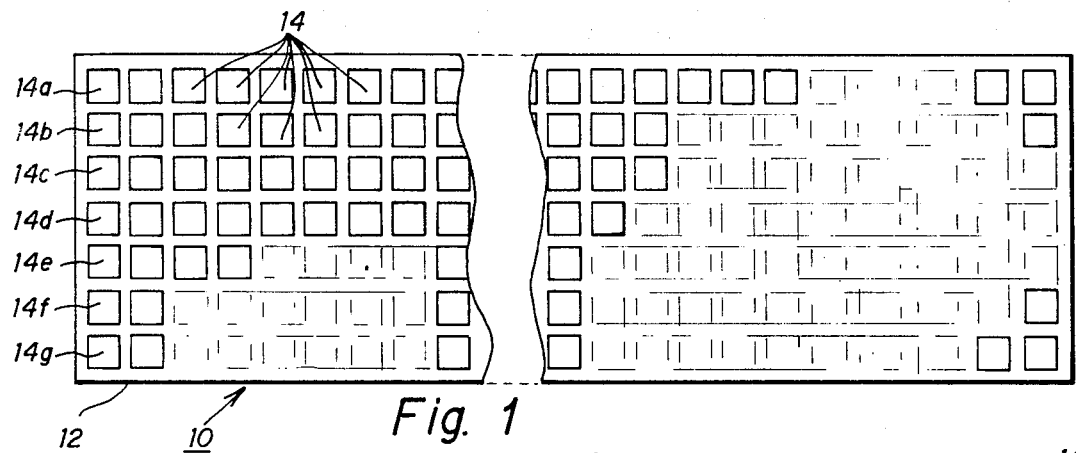
FIG. 1 is a simplified plan view of an imaging head in accordance with the present invention for producing matrix characters.

Referring now to the drawings, an imaging head in accordance with the present invention for producing a line of matrix characters is indicated generally by the reference numeral 10 in FIG. 1. The imaging head 10 is typically about eight inches long. The head 10 comprises a monocrystalline semiconductor substrate 12 upon which are formed seven rows $14_A - 14_G$ of discretely chargeable areas which are hereafter referred to as electrostatic field plates 14. These electrostatic plates are separate, physically or electrically, or both, one from another, so that they are discrete with regard to each other. The imaging head may be formed of one semiconductor crystal, or may be formed by several separate crystals disposed in end abutting relationship. The individual electrostatic plates 14 may be square and disposed on 0.015 inch centers so that a 5 × 7 matrix of the field plates may be used to form alphanumeric characters approximately the size produced by a standard typewriter.

Figure 2:
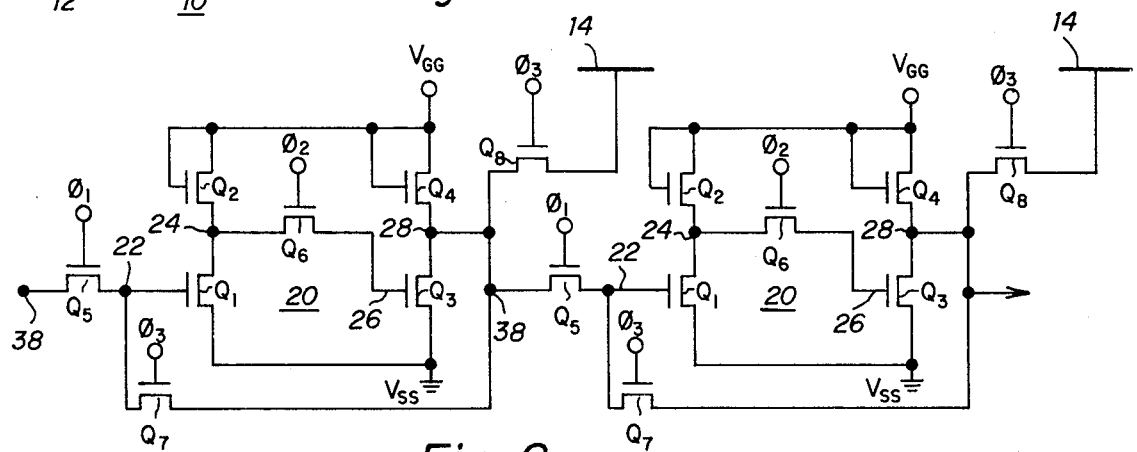
FIG. 2 is a schematic circuit diagram of a bistable circuit used in the head of FIG. 1.

Each field plate 14 is electrically isolated from the adjacent field plates and the potential of each field plate is controlled by a separate bistable circuit indicated generally by the reference numeral 20 in FIG. 2. The bistable circuits controlling the field plates in each row are connected into a serial shift register as illustrated in Figure. Thus, each of the field plates 14 in row $14_A$ is controlled by a single stage of one shift register, the field plates 14 of the second row $14_B$ are controlled by the stages of a second shift register, etc., so that there are seven parallel shift registers controlling the seven rows $14_A - 14_G$ of field plates 14.

Each bistable circuit 20 of the shift register is comprised of a first inverter stage comprised of enhancement mode field effect transistors $Q_1$ and $Q_2$ and a second inverter stage comprised of transistors $Q_3$ and $Q_4$. Data is transferred through transistor $Q_5$ to the gate node 22 of transistor $Q_1$ in response to a first clock pulse $\phi_1$. The voltage at the output node 24 of the first stage is then transferred to the gate node 26 of transistor $Q_3$ by transistor $Q_6$ in response to a second clock pulse $\phi_2$. The voltage at the output node 28 is then transferred to the input node 22 of the next bistable circuit of the shift register. The shift register operates in the dynamic mode, using only clock pulses $\phi_1$ and $\phi_2$ while data is being loaded into the shift register. The output node 28 is also coupled back to the gate node 22 of transistor $Q_1$ by transistor $Q_7$ in response to clock pulse $\phi_3$ to provide static operation. The output node 28 is also connected by transistor $Q_8$ to the respective field plate 14 in response to the third clock pulse $\phi_3$. Each stage of the shift register is identical to that just described and corresponding components of the second bistable circuit 20 are accordingly designated by the same reference characters.

In the operation of the shift register of FIG. 2, clock pulses $\phi_1$ and $\phi_2$ occur alternately. Clock pulse $\phi_3$ occurs only in the absence of clock pulses $\phi_1$ and $\phi_2$. Upon the occurrence of clock pulse $\phi_1$, the data at the input node 38 of each stage is transferred through transistor $Q_5$ to the gate 22 of transistor $Q_1$. If the input 38 is at a logic "1" level, which is sufficiently high voltage to turn transistor $Q_1$ on, node 28 will be pulled to $V_{SS}$, which is the logic "0" level. When $\phi_1$ goes off, the logic 1 level at input 22 is stored by the capacitance of the node so that $Q_1$ remains on and node 24 remains near $V_{SS}$. Then on the occurrence of clock pulse $\phi_2$, transistor $Q_6$ is turned on, pulling gate node 26 down to turn transistor $Q_3$ off, thus causing output node 28 to go high to a logic 1 level one threshold below $V_{GG}$. This condition is held after clock pulse $\phi_2$ goes off as a result of the voltage stored on gate node 26. Thus after each set of clock pulses $\phi_1$ and $\phi_2$ the logic level at the input of the bistable circuit 20 is transferred to the output. The clock pulses $\phi_1$ and $\phi_2$ occur alternately at a rapid rate so that the shift register operates in the dynamic mode while data is being shifted into the register.

When the shift register is loaded, clock pulses $\phi_1$ and $\phi_2$ are terminated, and clock $\phi_3$ brought up to the logic 1 level. With clock $\phi_3$ high, transistor $Q_7$ connects the output 28 to the gate node 22 to latch up the bistable circuit and establish a static mode of operation. The third clock phase $\phi_3$ also turns transistor $Q_8$ on to connect output 28 of each bistable circuit to the respective field plate 14. The circuit could operate with the output 28 connected directly to the field plate 14. However, the relatively large capacitance of the field plate 14 would materially slow the operation of the circuit because the field plate 14 might have to be charged or discharged in response to each clock pulse $\phi_2$. By utilizing transistor $Q_3$ at each bit, the field plates 14 are charged only once after the shift register has been loaded with data and placed in the static mode.

Figure 3:
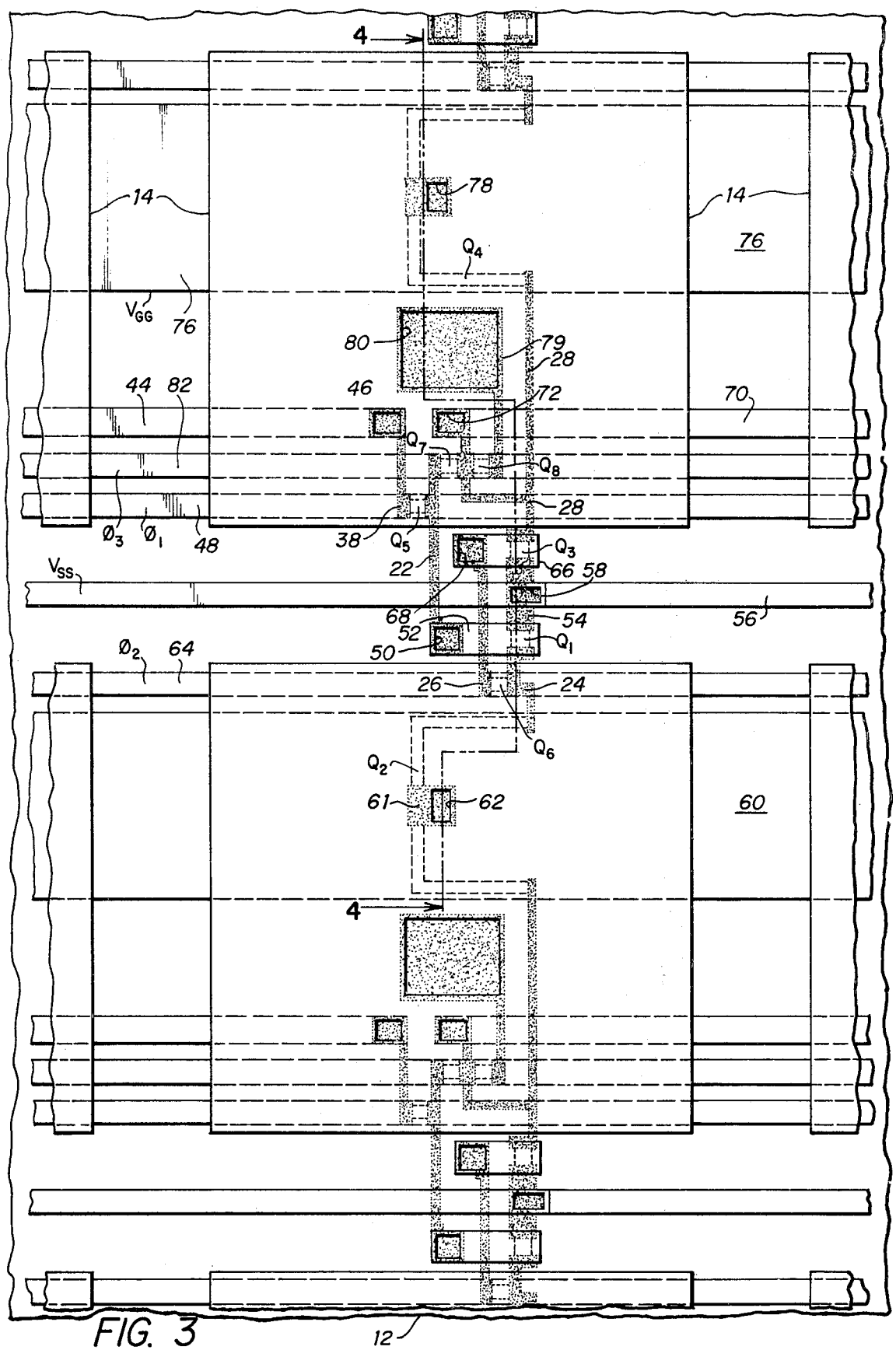
FIG. 3 is a detailed plan view of a small portion of the imaging head of FIG. 1 illustrating the layout of the bistable circuit of FIG. 2.
Figure 4:
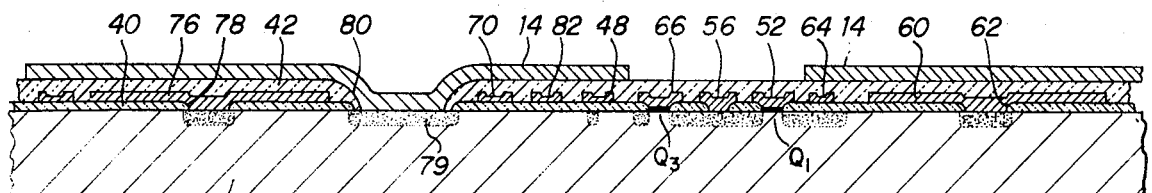
FIG. 4 is a simplied sectional view taken generally on line 4—4 of FIG. 3, with the vertical dimension substantially expanded relative to the horizontal dimension.

The manner in which the bistable circuit 20 of FIG. 2 may be formed on the semiconductor substrate 12 is illustrated in FIGS. 3 and 4. FIG. 3 is a plan view illustrating two complete bistable circuits 20 and the associated field plates 14. The two bistable circuits illustrated are not part of the same shift register. FIG. 4 is a sectional view taken on line 4—4 of FIG. 3. The components of the bistable circuits are designated by the same reference characters as those used in FIGS. 1 and 2, where appropriate. In FIGS. 3 and 4, the diffused regions are indicated by the stippled regions. The thin oxide regions forming the gate insulator of transistors are represented by the small dotted outlines and are designated by the transistor reference characters. The first level of metal interconnect line is insulated from the substrate 12 by a first oxide layer 40 which can be seen in FIG. 4. The field plates 14 are insulated from the first level of metal interconnect lines by a second oxide layer 42.

A metallized line 44 connects the data output of the preceding stage to node 38 through a contact opening 46 in the first insulating layer 40. Transistor $Q_5$ connects node 38 to diffused node 22 which is connected to metallized strip 52 through opening 50 in the oxide layer.

The gate of transistor $Q_5$ is provided by metallized strip 48 which carries clock pulse $\phi_1$ to all stages of that register. The source node 54 of transistor $Q_1$ is connected to metallized plate 56 through an opening 58 in the first oxide layer 40. The drain node 24 of transistor $Q_1$ is the source node of transistor $Q_2$. The channel of transistor $Q_2$ is shown in dotted outline and lies under a broad metallized strip 60 which carries the gate supply voltage $V_{GG}$. The drain node 61 of transistor $Q_2$ is connected to the gate supply voltage line 60 through opening 62. Transistor $Q_6$ is formed between diffused node 24 and diffused node 26. Metallized strip 64 forms the gate for transistor $Q_6$ and carries clock pulse $\phi_2$ to all stages of the shift register. Node 26 is coupled to the metallized gate 66 of transistor $Q_3$ through an opening 68 in the oxide layer 40. Node 28, which is the output of the circuit, is connected to the next succeeding stage of the shift register by a metallized conductor 70 which makes contact with node 28 through opening 72. Node 28 is also connected by the channel of transistor $Q_4$ to the metallized strip 76 which carries the gate voltage supply $V_{GG}$ through opening 78. The output node 28 is connected by the channel of transistor $Q_7$ back to the input node 22. Node 28 is also connected by the channel of transistor Q and diffused region 79 to the field plate 14 which extends through an opening 80 in both oxide layers 40 and 42. The gates of transistors $Q_7$ and $Q_8$ are formed by metallized strip 82 which carries clock pulse $\phi_3$. The field plates 14 of the circuit of FIG. 3 are typically placed on 0.016 inch centers. The circuits 20 are laid out using standard enhancement mode MOSFET design criteria for a single diffusion processing. Other configurations and processes such as bipolar, N-channel MOS, charge coupled devices, or complementary MOS are equally feasible.

Figure 5:
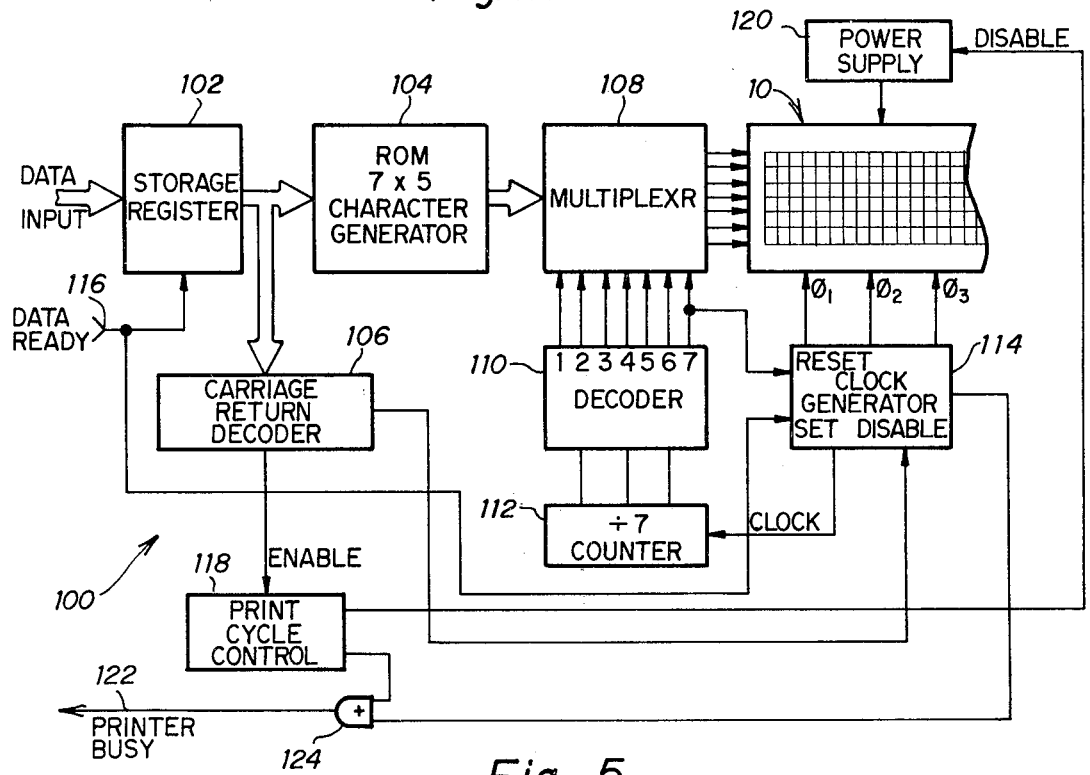
FIG. 5 is a schematic block diagram of a control system for programming the imaging head of FIG. 1.

A logic system for loading a line of alphanumeric matrix character data into the shift registers of the imaging head 10 is indicated generally by the reference numeral 100 in FIG. 5. Seven bit character data is first loaded in an input register 102. Alphanumeric character data may be in any suitable code such as, for example, the seven bit ASCII code.

The data stored in register 102 is applied to a read only memory 104 which converts the seven bit character data to thirty five bits representative of the states of the dots of a 7 × 5 dot matrix needed to form a visual image of the character. The data in register 102 is also applied to a carriage return decoder 106 which detects the specific character used to designate a carriage return signal at the end of the line.

The thirty five output lines from the read only memory 104 are applied to a multiplexer 108. The multiplexer 108 is controlled by the decoder 110 for a divide by seven counter 112 in a manner to sequentially select seven bits from the memory 104 representative of each of the five successive vertical columns and the two space columns of each character of the 7 × 5 matrix and apply the selected seven bits to the inputs of the seven shift registers of the imaging head 10. The counter 112 counts clock pulses produced by clock generator 114 in increments one count for each pair of clock pulses $\phi_1$ and $\phi_2$. The clock generator is initiated in response to a data ready input on terminal 116. When the carriage return decoder 106 detects a carriage return code, a cycle timer 118 is enabled. The cycle timer initiates operation of the printing mechanism indicated generally by the reference numeral 150 in FIGS. 6 and 7, and at an appropriate time disables the power supply 120 for the imaging head 10. A printer busy signal is produced at output 122 by gate 124 in response to a signal from clock generator 114 indicating a reset condition, together with a signal from the cycle timer 118 in response to a carriage return signal.

Assume now that a line of alphanumeric characters is to be loaded into the head 10. Seven bit data representative of the print character of the line is applied to storage register 102 and is immediately applied to the read only memory 104 and the carriage return decoder 106. This results in a 35 bit output from the read only memory 104 to the multiplexer 108 indicative of the first character in matrix form. When a data ready signal is received, the data in storage register 102 is latched and the clock generator 114 is initiated to produce clock pulses $\phi_1$ and $\phi_2$. The counter 112 will be at the count of one so that the seven bits of the first column of matrix data are shifted into the first bits of the seven parallel shift registers of the head 10 in response to the first clock pulses $\phi_1$ and $\phi_2$. The counter 112 is incremented in synchronism with the occurrence of each pair of clock pulses $\phi_1$ and $\phi_2$ so that the outputs of the decoder 110 sequentially select the successive columns of the matrix character signals and applies the bits to the inputs of the parallel shift registers of the head 10. The multiplexer 108 is hard wired to provide two blank columns to the shift registers when the decoder is in the sixth and seventh counts to provide spacing between adjacent characters. Variable width characters can be generated by a properly programmed read only memory to partially control the multiplexer.

Figure 9:
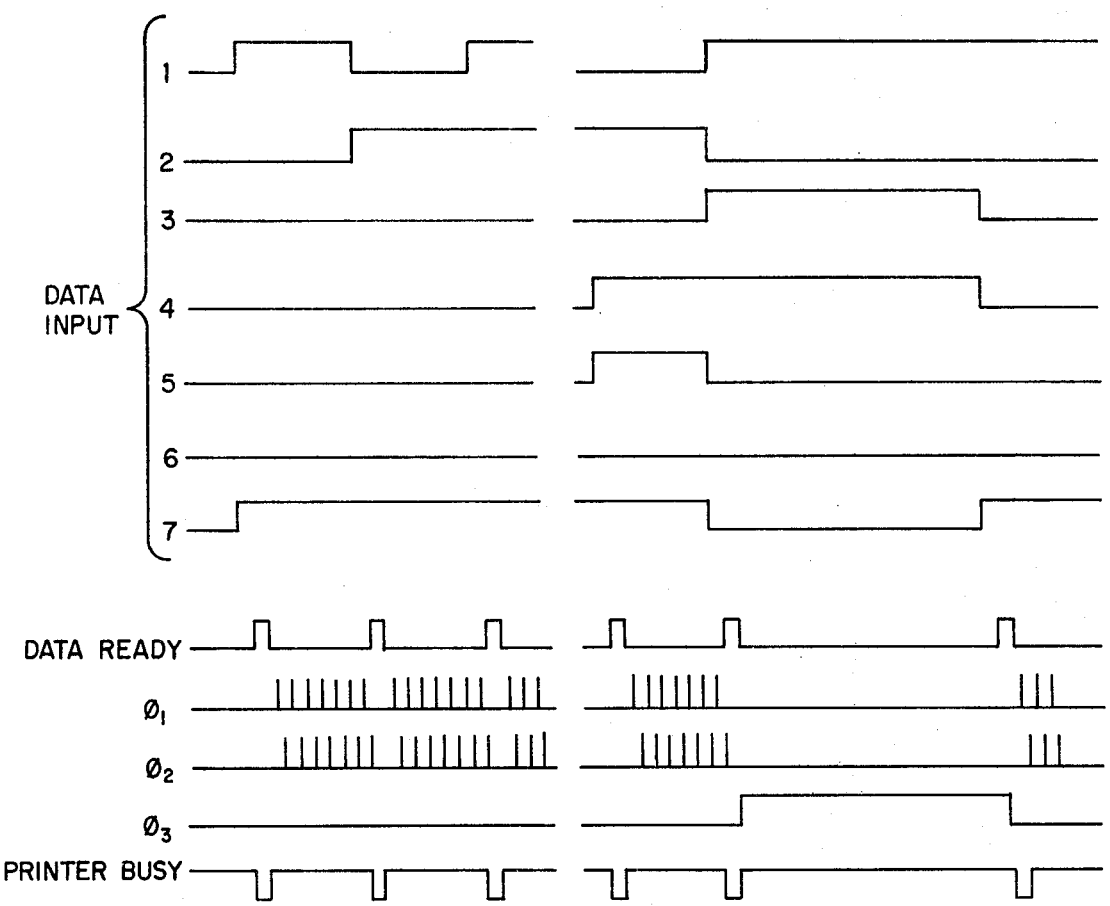
FIG. 9 is a timing diagram which assists in explaining the operation of the circuit of FIG. 5.

When the counter 112 has reached the count of seven, the clock generator 114 is reset so that no further clock pulses $\phi_1$ and $\phi_2$ are produced until the next data ready signal is received. Each successive character of the line is then input to register 102 and the sequence repeated each time, until the entire line of characters has been loaded into the shift registers. When a carriage return signal is received in storage register 102 and detected by decoder 106, the clock generator 114 is disabled from producing clock pulses $\phi_1$ and $\phi_2$ and produces a clock pulse $\phi_3$. This charges the field plates controlled by the bistable circuits containing a logic 1 to the gate supply voltage, less two threshold voltages. The field plates controlled by bistable circuits containing a logic 0 are kept at a voltage near ground. FIG. 9 is a timing diagram illustrating the relationship between the data input, in seven bit form, the data ready signal, clock pulses $\phi_1$, $\phi_2$ and $\phi_3$ and the printer busy signal.

After the occurrence of clock pulse $\phi_3$, a latent electrostatic image of the line of matrix characters is formed by the electrostatic field plates which have been charged to the logic 1 level. The electrostatic image may be developed by any of the techniques which have been devised for use in copying machines. A survey of this art may be found in the article "Xerographic Development Processes: A Review" by Thomas L. Thoursen, published in *IEEE Transactions on Electronic Devices*, VOL ED-19, No. 4, April 1972.

The Thoursen article describes cascade, magnetic, aerosol and liquid development systems in detail. Although any of these processes can be used, the magnetic brush technique will be used for illustrative purposes, it being understood that the others may be readily substituted therefor.

In the magnetic development system, particles of a pigment are coated with a thermoplastic resin and mixed with 0.002 to 0.008 inch diameter iron particles. Preparation of such mixtures is fully described in Giaimo U.S. Pat. No. 2,786,440, and such mixtures are commercially available from sources such as the Addressograph-Multigraph Corporation, Cleveland, Ohio, as "Type D Electrostatic Toner, 2000 Series."

The latent image on element 10 is developed by passing a magnet which has been coated with the iron-toner mixture near the surface of the element. Because of the magnetic field, the iron particles from fine fiber like chains projecting from the magnet. Each iron particle in the chain is coated with a layer of toner particles. The A-M Corporation Series 2000 toner is designed with positively charged particles which are attracted to and adhere to the negatively charged electrostatic field plates 14. If desired, a bias voltage may be applied to the magnet to aid the transfer of particles. If the magnet is biased to a voltage midway between the logic 1 and logic 0 levels on the field plates, the particles will be attracted to those which are negatively charged, and strongly repelled from those which are positively charged. Under this condition, twenty volts between the logic 0 and logic 1 levels on the field plates is sufficient for an image of good quality.

After the brush has passed over the print head 10, a layer of toner particles will remain on the positively charged field plates. The particle layer may then be transferred to a sheet of plain paper by pressure contact, the use of an electrostatic aiding field, or both. The particles may then be fused to each other and to the paper by heating to 150°F or higher for a short time.

Many permutations of the process which have been described are equally feasible. Toner can be prepared with positively charged or negatively charged particles. The read only memory 104 may of course be programmed to give positive or negative outputs for the desired characters. Any of the known development processes may be used.

Figure 6:
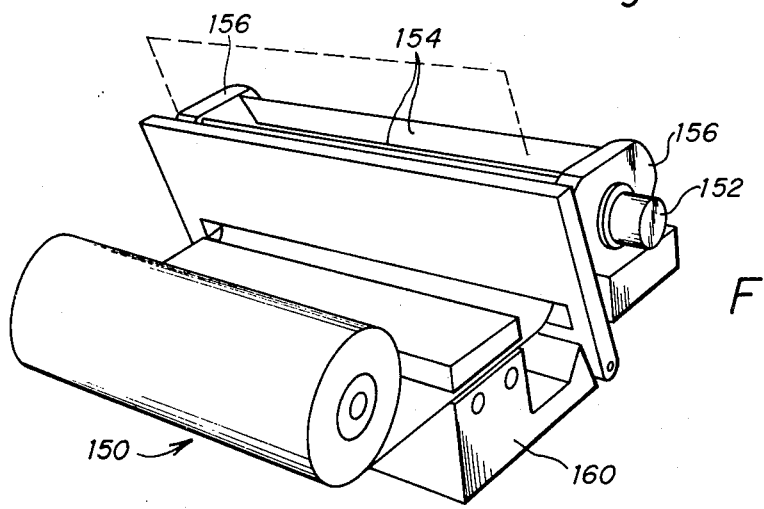
FIG. 6 is a simplified perspective view of a line printer utilizing the imaging head of FIG. 1 and the programming circuit of FIG. 5.
Figure 7:
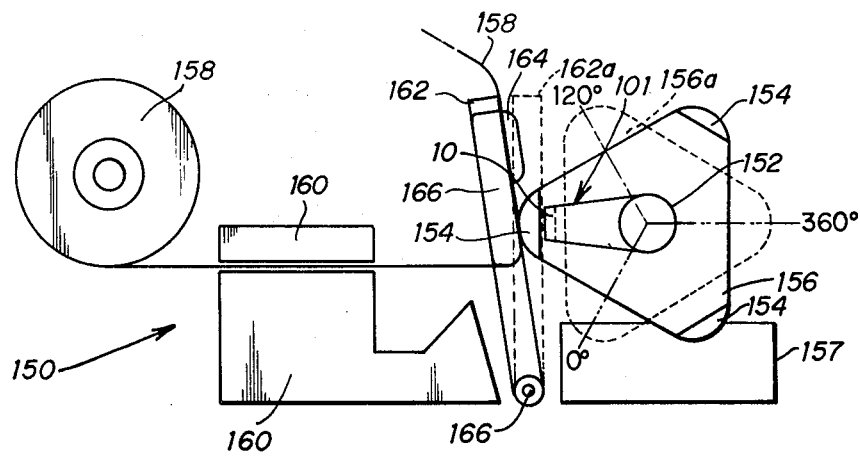
FIG. 7 is a simplified end view of the apparatus illustrated in FIG. 6.

A simple line printer which may use the imaging head 10 and the control circuitry 100 is indicated generally by the reference numeral 150 in FIGS. 6 and 7. A single imaging head 10 is mounted on a fixed shaft 152, as can best be seen in FIG. 7. Three magnetic brushes 154 extend between a pair of cam plates 156 which are rotatably journaled on the fixed shaft 152. The magnetic brushes 154 are positioned to first pass through a toner bath 157, then pass in close proximity to the imaging head 10 as they are rotated by a suitable stepping drive mechanism (not illustrated). Paper from a roll 158 passes through a paper advancing mechanism 160 and then through a platen 162. The platen 162 is pivotally mounted on pivot axis 166 and is spring biased against the cam plates 156. When the cam plates 156 are in the first at-rest position shown in dotted outline 156a, the paper carried by the platen is in contact with the imaging head 10. As the cam plates 156 are rotated through the position shown in solid outline, the platen 162 and paper carried by the platen are momentarily moved away from the head 10 to allow the magnetic brush 154 to pass near the face of the imaging head, then moved back into position against the head 10 when the cams 156 again reached the position shown by the dotted outline 156a.

Figure 8:
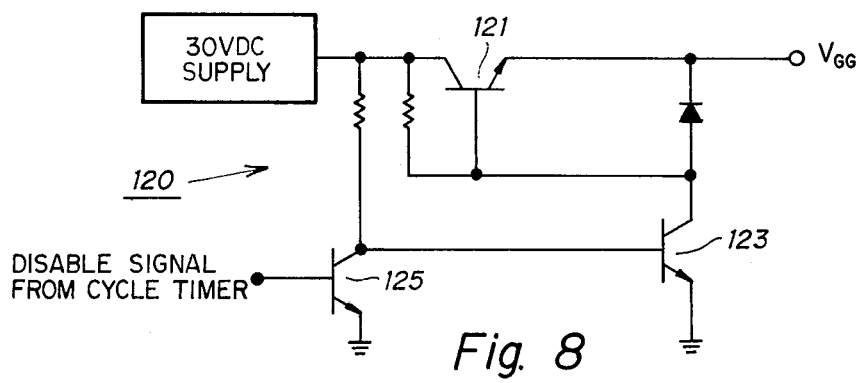
FIG. 8 is a schematic circuit diagram of a portion of the system of FIG. 5.

A relatively high potential, typically several hundred volts, is applied to an electrode 166 to transfer the toner adhering to the field plates to the paper after the paper is again against the head 10. At the same time, the power supply $V_{GG}$ to the head 10 may be interrupted using the circuit illustrated in FIG. 8 in response to a disable signal from the cycle timer 118. This is achieved by switching transistor 121 off and switching 123 on in response to a positive voltage signal applied to the base of transistor 125. This effectively shorts the elements of print head 10, minimizing the possibility of damage to the transistors of the print head.

Figure 10:
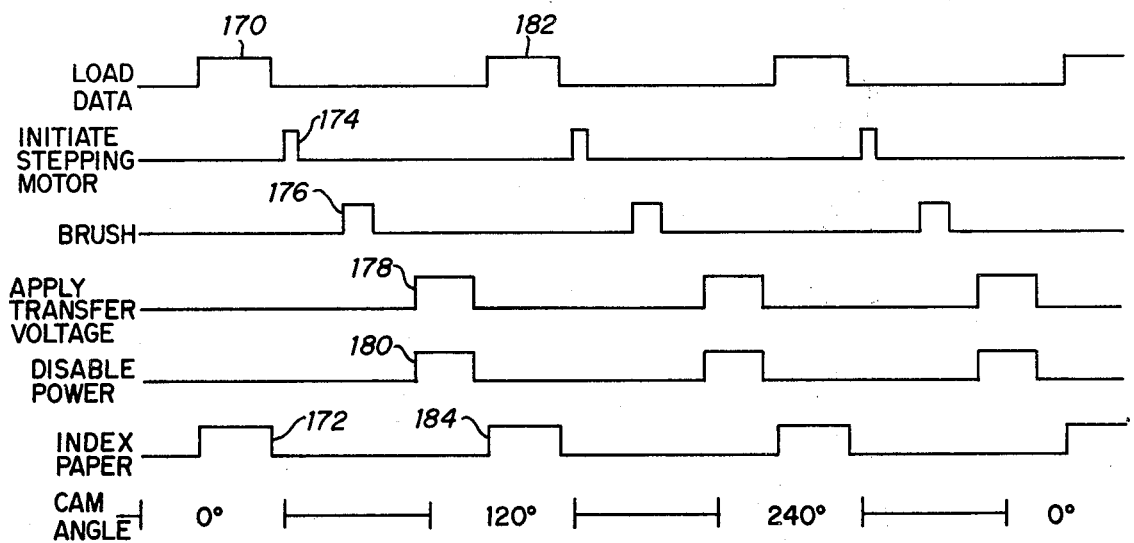
FIG. 10 is a timing diagram which illustrates the sequence of operation of the line printer of FIG. 6.

The sequence of operation of the printer 150 is illustrated in FIG. 10. A line of data is loaded into head 10 during interval 170. During the same interval, the paper is indexed as represented at 172 to the next line position by the indexing mechanism 160. At the conclusion of the data loading period, which may be signaled by clock pulse $\phi_3$, the stepping motor is initated at 174. The steeping motor rotates the cam plates 156, through 120° as indicated in FIG. 7. As a result, one of the brushes passes the imaging head 10 during time interval 176, which occurs at approximately 60° of rotation of the cam shaft. After the field plates which are charged are coated with toner, the transfer voltage is applied to the electrode 166 during interval 178. At the same time, the power supply voltage $V_{GG}$ to the head 110 is disabled by the circuit illustrated in FIG. 8, as indicated at 180 in FIG. 10. At the start of the next load data interval 182, the paper is again indexed at 184 to start the next print cycle. This sequence of events is repeated three times for each revolution of the cam plates 156. The cam plates 156 can be step-rotated at 200 r.p.m., providing 600 printed lines per minute.

The imaging head 10 thus provides a relatively high speed, low cost line printer which operates directly from voltage levels normally associated with digital systems. While the matrix type characters do not have an appearance suitable for all applications, this type character is suitable for many applications where readability is the primary consideration.

Figure 11:
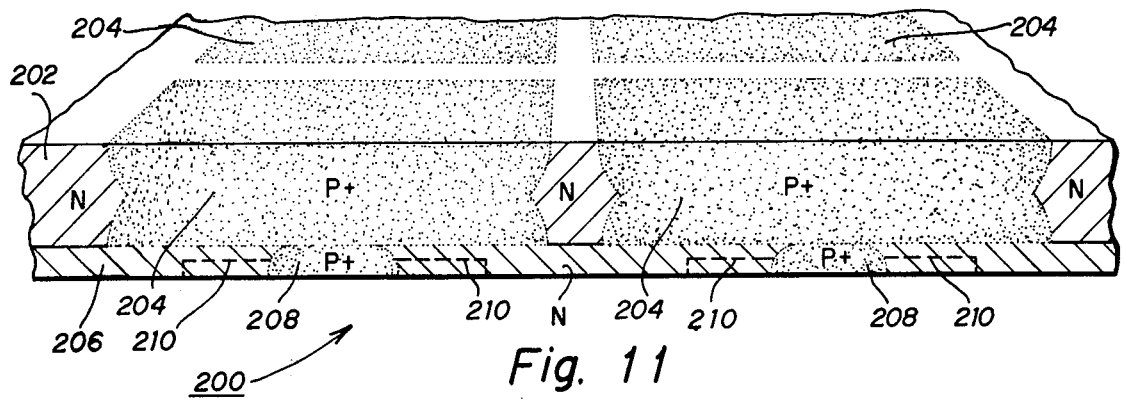
FIG. 11 is a sectional view illustrating another imaging head in accordance with the present invention.

Another imaging head in accordance with the present invention is indicated generally by the reference numeral 200, in FIG. 11. The imaging head 200 is comprised of a monocrystalline N-type semiconductor substrate 202. A plurality of discretely chargeable areas or field plates 204 are formed by heavily doped P-type diffused regions which extend completely through the substrate. The field plates 204 may be formed by making simultaneous P-type diffusions from opposite sides of a relatively thin N-type substrate. An N-type epitaxial layer is then grown on the back surface of the substrate 202 to complete the isolation pocket. A P-type diffusion 208 is then made completely through the relatively thin N-type epitaxial layer 206 so as to contact each P-type diffused region 204. Any suitable bistable circuit may then be fabricated at the surface of the N-type layer 206 generally within the region 210 defined by the dotted outline. The outputs of the bistable circuits can then be connected to the P-type contact regions 208, and thus to the discretely chargeable, P-type field plates 204. The bistable circuits may be fabricated using either field effect or bipolar integrated circuit technology.

Figure 12:
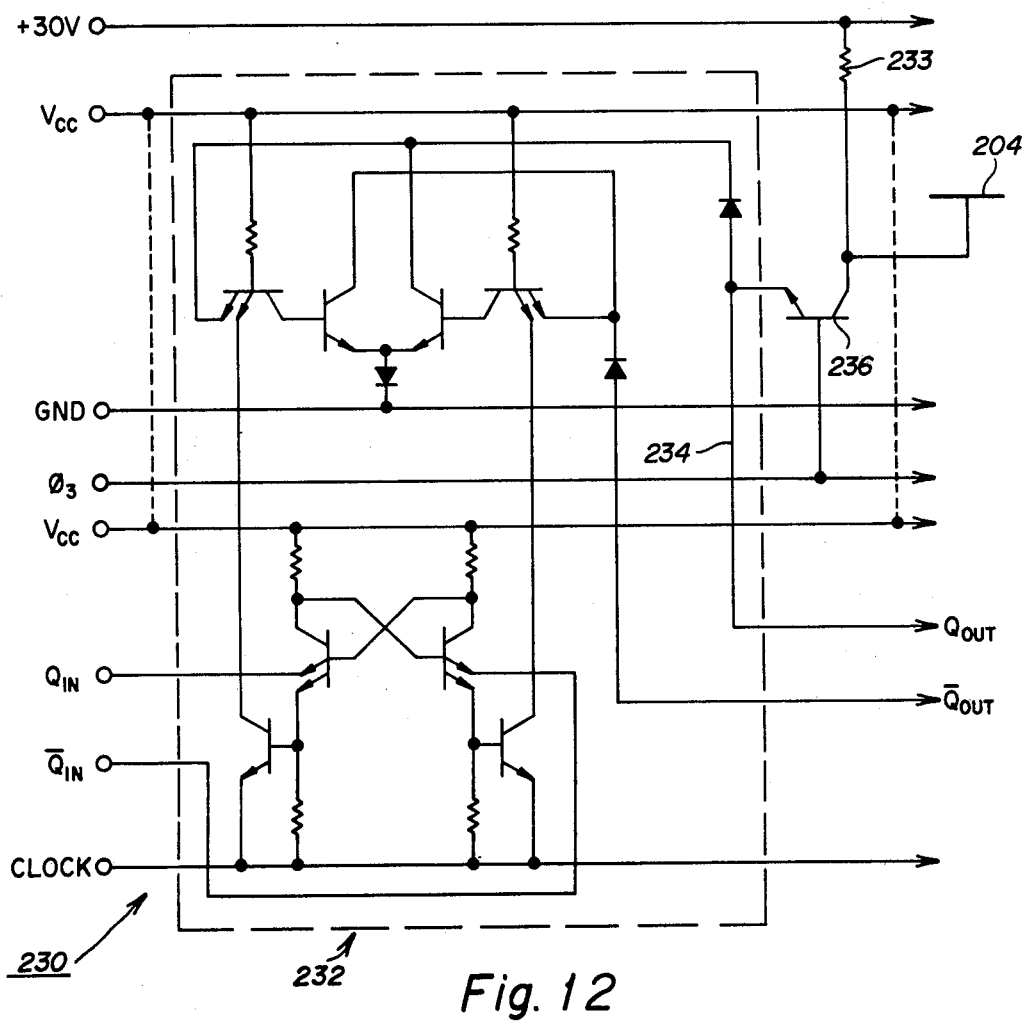
FIG. 12 is a schematic circuit diagram of another bistable circuit which may be used in connection with an imaging head in accordance with the present invention.

Another bistable circuit which can be used to control the charge on the field plate of either the imaging head 10 or the imaging head 200 is indicated generally by the reference numeral 230 in FIG. 12. The basic bistable circuit disclosed within the dotted outline 232 is electrically identical with the commercially available low power shift register sold by Texas Instruments as Part 74L91. Accordingly, the portion of the circuit within the dotted outline 232 will not be described in detail. The field plate 204 to be controlled by the bistable circuit is connected through a resistor 233 to a positive voltage supply, and is connected by the collector-emitter circuit of transistor 236 to the true output 234 of the bistable circuit 234. When the output 234 is at a logic 1 level, transistor 236 is biased off so that the field plate 204 is charged to +30 volts. When the output 234 is at a logic 0 level and clock line $\phi_3$ is at a positive voltage, transistor 236 conducts so that field plate 204 is discharged to ground. In the event a positively charged toner is to be used, the voltage supply would be a negative voltage and transistor 236 would be a P-N-P transistor.

Figure 13:
FIG. 13 is a schematic block diagram of a facsimile system in accordance with the present invention.

A facsimile transmission system in accordance with the present invention is indicated generally by the reference numeral 250 in FIG. 13. The facsimile transmission system 250 includes a scanning and encoding system 252 for scanning the image to be transmitted and producing digital signals which will presently be described in detail. A transmitter 254 transmits the digital signals by wire, microwave, radio or the like, to a receiver 256. The digital signals are then applied to a decoder and printer 258. The scanning and encoding system 252, the transmitter 254 and the receiver 256 may be of conventional design and, accordingly, are not herein described in detail. The decoder and printer 258 may utilize the mechanical apparatus 150 illustrated in FIGS. 6 and 7 except that the imaging head indicated generally by the reference numeral 260 in FIG. 14 is employed and the imaging head is controlled by the control circuit indicated generally by the reference numeral 270 in FIG. 15.

More specifically, the imaging head 260 for the facsimile decoder and printer 258 is fabricated in accordance with the techniques described in connection with imaging head 10 of FIG. 1, or the imaging head 200 of FIG. 11, except for the shape of the discretely chargeable areas. The imaging head 260 is provided with a row of elements 262 which may extend across an entire page. Each element includes three separately controllable field plates 262a, 262b and 262c. The areas of the field plates 262a, 262b, and 262c are in the binary relationship 4:2:1. The field plates 262a, 262b and 262c are controlled by a bistable circuits 264a, 264b and 264c, respectively. The bistable circuit elements are connected in one or more shift registers to facilitate loading the data into the head as will presently be described. The individual dots 262 may be typically placed on 0.006 inch centers so as to provide a resolution of 167 lines per inch. The shift register stages 264a–264c may be substantially identical to the shift register bits described in connection with the imaging head 10. The discretely chargeable areas or field plates 262a, 262b and 262c may be either metallized areas or regions of one conductivity type isolated by regions of the other conductivity type. Any other suitable shift register circuit can also be used.

Figure 14:
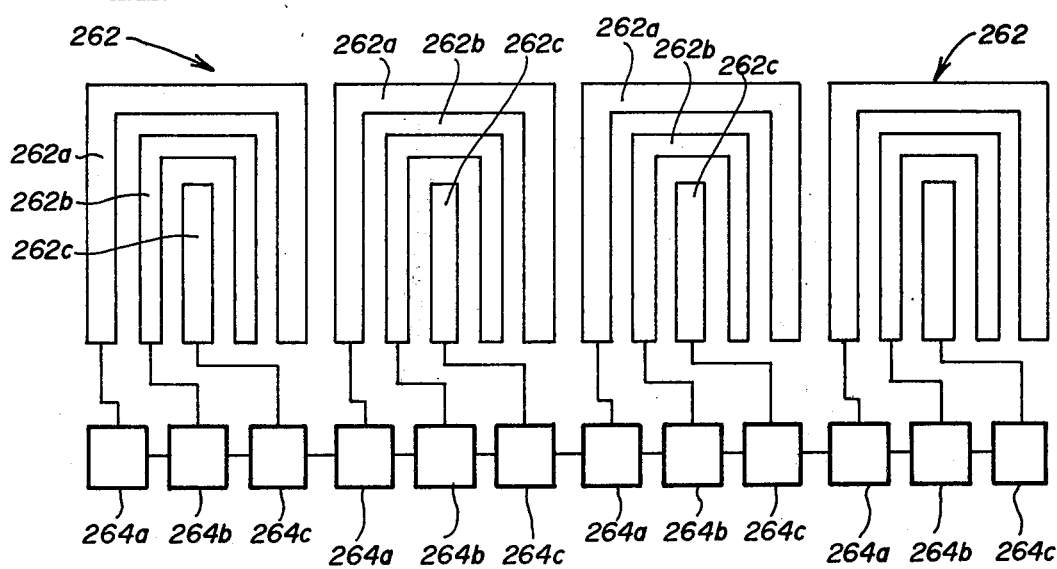
FIG. 14 is a detailed plan view of a small portion of imaging head of the facsimile system illustrated in FIG. 13.
Figure 15:
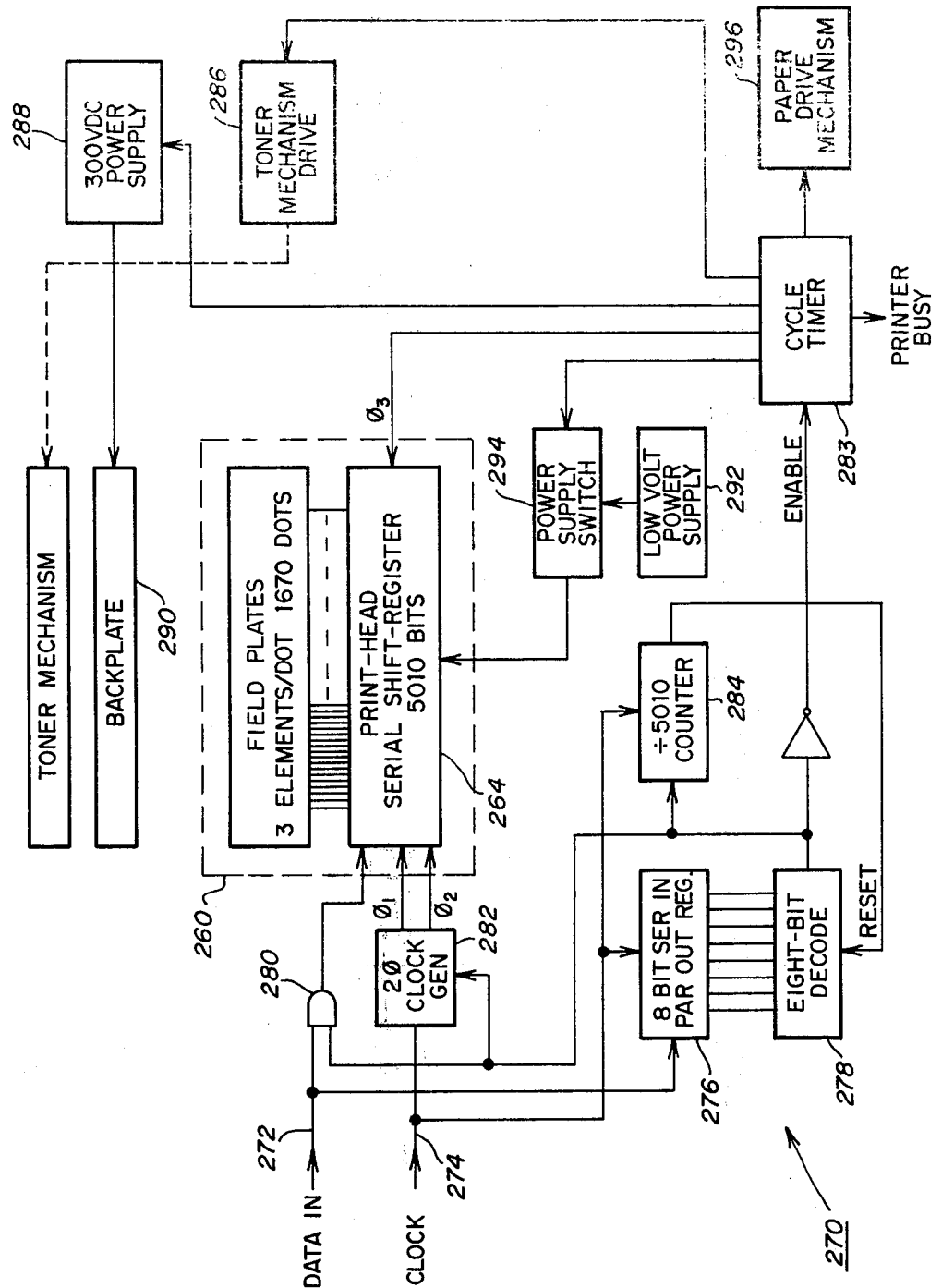
FIG. 15 is a schematic block diagram of a system for programming the imaging head of FIG. 14.

The facsimile head 260 of FIG. 14 is programmed by the circuitry indicated generally by the reference numeral 270 in FIG. 15. It is assumed that the scanning and encoding circuit 252 scans the document being encoded and produces 5,010 bits for each line which is serially transmitted by the transmitter 254 and received by the receiver 256. Each three successive bits are representative of eight shades of gray at the point on the document being scanned. The serial bits are output from the receiver 256 to input 272. The receiver 256 also provides a clock signal which is input on 274. The first eight bits of the line of data are shifted into a serial-in, parallel-out shift register 276. Eight bits precede a line of data and contain a start data line code which is detected by decoder 278. Decoder 278 then produces an enable signal which is applied to gate 280 and to a clock generator 282. The data is then gated into the 5,010 bit shift register of the facsimile head 260 in response to the clock pulses at input 274. The clock pulses at input 274 also increment a ÷ 5,010 counter 284. After 5,010 counts, the counter 284 resets the decoder 278, which disables both gate 280 and also the clock generator 282 to freeze the data in the shift register 264. At the time the decode circuit 278 is reset, the cycle timer 283 is enabled. The cycle timer 283 then sequentially (a) generates the enabled clock pulse $\phi_3$ to charge the field plates of the imaging head in accordance with the data stored in the shift register, (b) activates the toner mechanism stepping motor 286, (c) enables the high power voltage supply 288 to charge the back plate 290 to a high voltage and thus transfer the toner from the imaging head to the paper while simultaneously disabling the low voltage power supply 292 by activating the power supply switch 294, (d) activates the paper drive mechanism 296 to step the paper one line, and (e) terminates a printer busy signal to enable the next line of data to be input so that the cycle can be repeated.

It is to be understood that field plates having other shapes may also be used in the facsimile head 260. In particular it will be appreciated that a single series of solid dots could be used to provide greater resolution but not a half tone capability. The half-tone capability can be provided by any shape of field plates having a progression of sizes. Of course 16 shades of gray can be provided with four bistable bits and four field plates having areas in the ratio 1:2:4:8.

Figure 16:
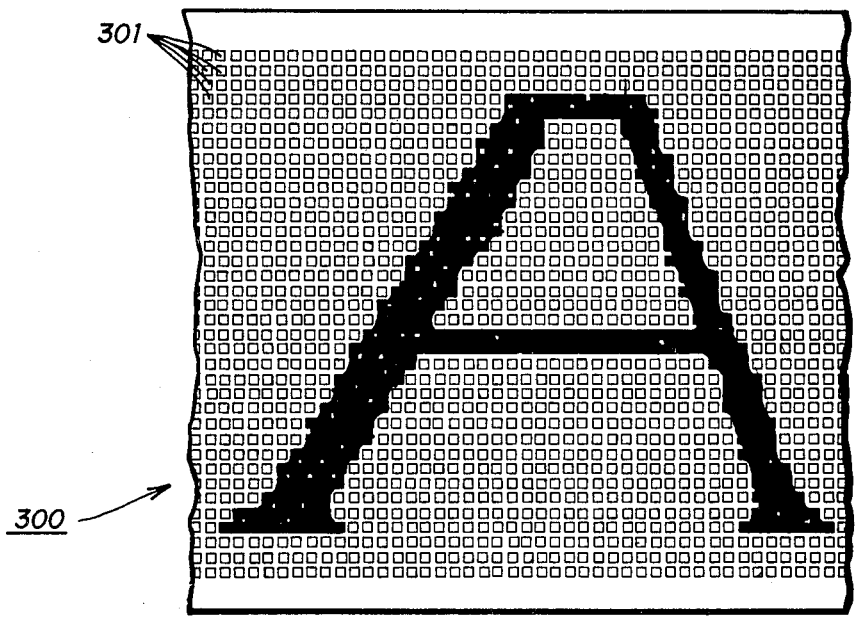
FIG. 16 is a schematic plan view of a portion of an imaging head in accordance with this invention having a high density of discretely chargeable areas and showing an alphanumeric character which might be produced by the head superimposed thereon to indicate relative size.

As previously described, the imaging head 10 in FIG. 1 utilizes a 5×7 matrix to produce alphanumeric characters in response to a computer input. The imaging head 260 of FIG. 14 provides a half tone system which can be programmed by digital signals suitable for facsimile transmission. Still another type of imaging head in accordance with the present invention is indicated generally by the reference numeral 300 in the schematic representation of FIG. 16. The imaging head 300 is characterized by having a very large number of discretely chargeable areas or field plates 301, each controlled by a bistable circuit. The bistable circuits are programmed on a geometrical basis by energy, such as light or electricity, coupled directly to the face of the imaging head. The individual field plates 301 are very small so that a typical character 0.15 inch superimposed upon the head 300 might appear as the character A, for example, as shown in FIG. 16. The exact number of lines of resolution producible by the head 300 is somewhat dependent upon the particular technology used to fabricate the bistable circuits as will presently be described. Utilization of this type of head permits the production of fanciful characters which are more easily read or more pleasing in appearance than the matrix type characters produced by the head 10. This type of head also provides high resolution when reproducing documents having printed or pictorial data as will presently be described.

Figure 17:
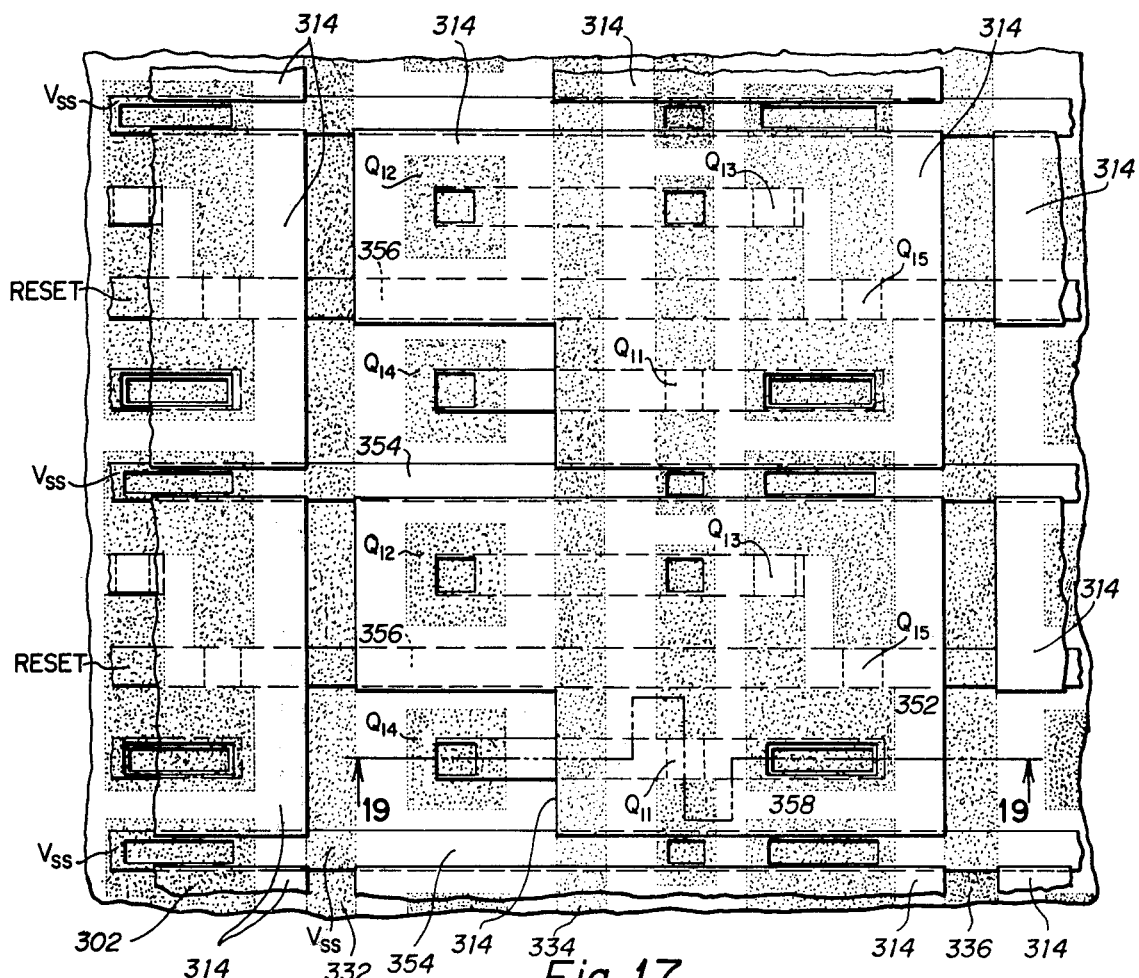
FIG. 17 is a plan view of a small portion of a high density imaging head of the type illustrated in FIG. 16 which can be programmed by a light image.
Figure 19:
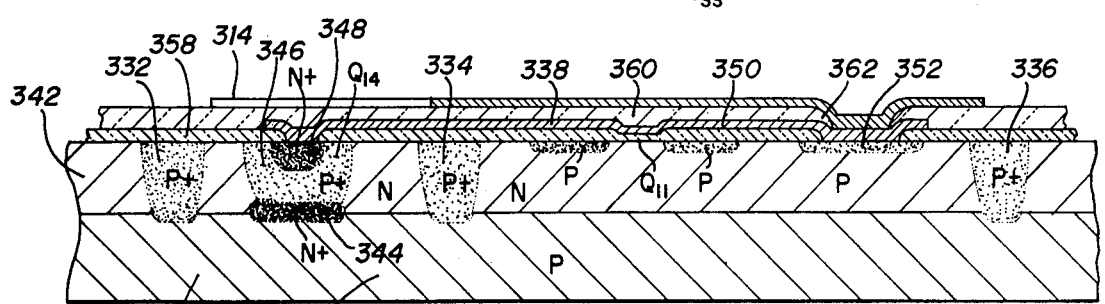
FIG. 19 is a sectional view taken substantially on lines 19—19 of FIG. 17.

One embodiment of the head 300 is indicated generally by the reference numeral 302 in FIGS. 17 and 19. The head 302 has a very large number of small field plates 314.

Figure 18:
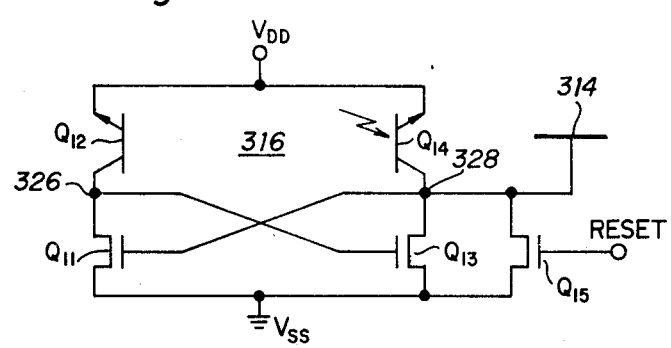
FIG. 18 is a schematic circuit diagram of one of the bistable circuits used in the imaging head of FIG. 17.

A bistable circuit 316, as illustrated in FIG. 18, controls the potential on each field plate 314. Each bistable circuit 316 is comprised of a pair of cross coupled legs, one leg including bipolar load transistor $Q_{12}$ and field effect switching transistor $Q_{11}$ and the other leg including light sensitive bipolar load transistor $Q_{14}$ and field effect switching transistor $Q_{13}$. The output node 326 of the first leg is cross coupled to the gate of transistor $Q_{13}$ and the output node 328 of the second leg is cross coupled to the gate of transistor $Q_{11}$. The output node 328 of the second leg is also connected to the field plate 314. A reset field effect transistor $Q_{15}$ is connected in parallel with transistor $Q_{13}$. The light sensitive transistor $Q_{14}$ is characterized by the fact that the impedance of the device is greatly reduced when the device is exposed to light, particularly light having the wave length produced by Ga as light emitting diodes.

When reset transistor $Q_{15}$ is momentarily turned on, node 328 is pulled down to $V_{ss}$, which is considered a logic 0 level, thus switching transistor $Q_{11}$ off. This causes node 326 to go high, which holds transistor $Q_{13}$ on, thus latching the output 328 to a logic 0 level near $V_{ss}$. Then when transistor $Q_{14}$ is exposed to light, its impedance is greatly reduced so that node 328 goes sufficiently high to turn transistor $Q_{11}$ on, thus pulling node 326 down toward $V_{ss}$ which turns transistor $Q_{13}$ off. This allows node 328 to go all the way toward $V_{DD}$ which latches transistor $Q_{11}$ on and transistor $Q_{13}$ off. This charges field plate 314 substantially to the potential of $V_{DD}$ until such time as reset transistor $Q_{15}$ is again turned on. The drain supply voltage $V_{DD}$ will be either positive for N-channel MOSFETs, or negative for P-channel MOSFETs, and the toner polarity selected accordingly.

Each bistable circuit 316 may be laid out as indicated in FIGS. 17 and 19. The bipolar transistors $Q_{12}$ and $Q_{14}$ are fabricated between P-type isolation diffusions 332 and 334. The field effect transistors $Q_{11}$, $Q_{13}$ and $Q_{15}$ are fabricated between isolation diffusion 334 and isolation diffusion 336. The head 302 is comprised of a P-type substrate 340, upon which is formed an N-type epitaxial layer 342. A heavily doped N-type diffused region 344 is made in the substrate 340 before formation of the N-type epitaxial layer 342 and forms the emitter of transistor $Q_{14}$. Heavily doped P-type isolation regions 332, 334 and 336 are then made by diffusion through the N-type epitaxial layer 342. The P-type base diffusion 346 of transistor $Q_{14}$ may be made at the same time as the isolation diffusion. The P-type diffusion for the field effect transistors and the heavily doped N-type diffusion to form region 348 for the collector of transistor $Q_{14}$ complete the diffusion process.

A first patterned metallized layer forms the interconnect 350 which connects the collector of transistor $Q_{14}$ to the drain node 352 of transistors $Q_{13}$ and $Q_{15}$ and also forms the gate of transistor $Q_{11}$ (see FIGS. 17 and 19). The metallized strips 356 which forms the gate of transistor $Q_{15}$ are formed over an oxide insulating layer 358 at the same time. These metallic interconnects are then covered with a second insulating layer 360 upon which are deposited the field plates 314. The field plates 314 connect to the metallized film 350 through an opening 362 in the second oxide layer 360.

It will be noted that the light sensitive transistor $Q_{14}$ is not covered by the metallized field plate. As a result, the imaging head 302 can be programmed by first pulsing all reset transistors $Q_{15}$ on to set the bistable circuits to the logic 0 state so that the field plates 314 will be discharged to the substrate potential. Then when the head is exposed to a light image, such as the character A illustrated in FIG. 16, those bistable circuits having transistors $Q_{14}$ exposed to the light will be set to the logic 1 state and the corresponding field plates will be charged to a positive or negative potential, thus providing a latent electrostatic image which can be developed and printed using the techniques heretofore described. Method and apparatus for producing the light image are hereafter described in greater detail.

Figure 20:
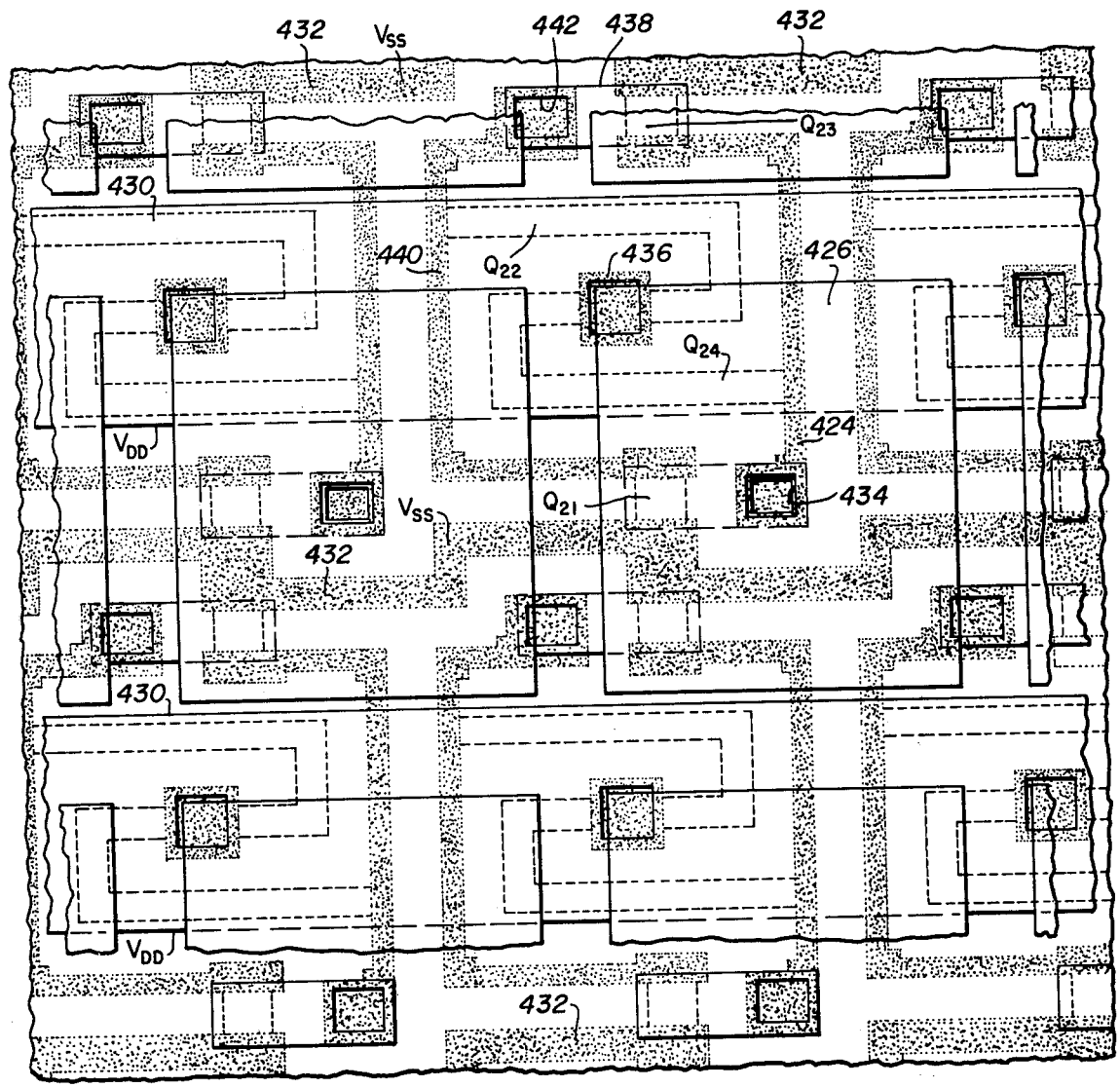
FIG. 20 is a plan view of a small portion of a high density imaging head of the type illustrated in FIG. 16 which can be programmed by capacitive or resistive coupling.
Figure 21:
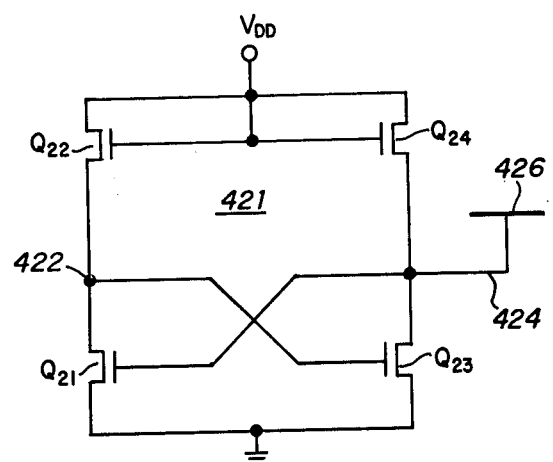
FIG. 21 is a schematic diagram of one of the bistable circuits used in the imaging head of FIG. 20.

Another high density, directly programmable imaging head of the type shown in FIG. 16 is indicated generally by the reference numeral 420 in FIG. 20. FIG. 21 discloses a simple bistable circuit 421 for the imaging head 420 which is comprised of field effect transistors $Q_{21}$, $Q_{22}$, $Q_{23}$ and $Q_{24}$. Transistors $Q_{21}$ and $Q_{22}$ form a first stage with transistor $Q_{22}$ as a saturated load, while transistors $Q_{23}$ and $Q_{24}$ form a second stage with transistor $Q_{24}$ as the saturated load. All transistors are enhancement mode devices. The output node 422 of the first stage is cross coupled to the gate of transistor $Q_{23}$, and the output node 424 of the second stage is cross coupled to the gate of transistor $Q_{21}$. The output node 424 is also connected directly to the respective field plate 426.

The bistable circuit 421 is programmed by a voltage signal applied directly to the field plate 426 either by capacitive coupling or resistive coupling, as will hereafter be described in greater detail. Thus, when a voltage having the same polarity as the drain supply voltage $V_{DD}$ is coupled to the gate of transistor $Q_{21}$, transistor $Q_{21}$ is switched on, causing node 422 to go low. This turns transistor $Q_{23}$ off, which holds node 424 high and keeps transistor $Q_{21}$ on after the voltage is decoupled from the field plate 426. The bistable circuit 421 may then be considered as in the logic 1 state. Field plate 426 is then held high because transistor $Q_{23}$ is off, the voltage on the field plate 426 being approximately one threshold below the drain supply voltage $V_{DD}$. When a voltage approaching the substrate supply voltage $V_{SS}$ is coupled to field plate 426, transistor $Q_{21}$ is turned off, causing node 422 to go high, which turns transistor $Q_{23}$ on, thus causing node 422 to approach the substrate supply voltage $V_{SS}$ and latching the circuit in the logic 0 state.

FIG. 20 is a plan view of the manner in which the circuit 421 of FIG. 21 can be fabricated using conventional enhancement mode MOSFET technology. In FIG. 20, all stippled areas represent diffusions, typically P-type in an N-type substrate to produce P-channel devices, or N-type diffusions in a P-type substrate to produce N-channel devices. The type of device chosen determines the polarity of the charge on the field plate 426 in the logic 1 state, which is the polarity of the drain supply voltage $V_{DD}$. The drain voltage supply $V_{DD}$ is carried by metallized strips 430. The substrate supply voltage $V_{SS}$ is carried by diffused lines 432. The reference characters $Q_{21}$, $Q_{22}$, $Q_{23}$ and $Q_{24}$ are applied to FIG. 20 only for the bistable circuit associated with the single field plate designated by the reference character 426 so that the circuit for the one field plate can be more easily traced. However, it will be appreciated that the circuit layout is repeated for each field plate on the head. The field plate 426 is coupled to diffused region 424 through an opening 434 in the oxide insulation (not designated by a reference character). The output stage comprised of transistors $Q_{23}$ and $Q_{24}$ of the bistable circuit can be traced from diffused region 436, which is connected to metallized strip 430 to provide the drain supply voltage $V_{DD}$, through the channel which is designated by the reference character $Q_{24}$ to diffused node 424. The metallized strip 430 is the gate for transistor $Q_{24}$. Node 424 extends upwardly to form the drain node of transistor $Q_{23}$. The source of transistor $Q_{23}$ is simply the diffused substrate supply voltage line 432. The gate of transistor $Q_{23}$ is formed by a metallized strip 438 which is connected to diffused node 440 through an opening 442 in the oxide layer. The input stage comprised of transistors $Q_{21}$ and $Q_{22}$ may be traced from the diffused node 436 through the channel of transistor $Q_{22}$ to node 440, then through the channel of transistor $Q_{21}$ to diffused line 432, which provides the source supply voltage $V_{ss}$.

The imaging head 450 may be programmed by first coupling a voltage near the substrate supply voltage to all of the field plates to "reset" the bistable circuit to the logic 0 state. Then the head is "exposed" to the desired image, such as the character "A", by placing an electrode in the shape of the character "A" in close proximity to the field plates and pulsing the electrode with a voltage having a polarity corresponding to the drain supply voltage. This sets the bistable circuit shadowed by the electrode to the logic 1 state as a result of the voltage being capacitively coupled to the field plates to produce a latent electrostatic image of the character. The latent image can then be developed and printed as heretofore described. Alternatively, the voltage carried by the character electrode may be coupled to the adjacent field plates by a resistive powder, such as xerographic toner, to set the bistable circuits.

Figure 22:
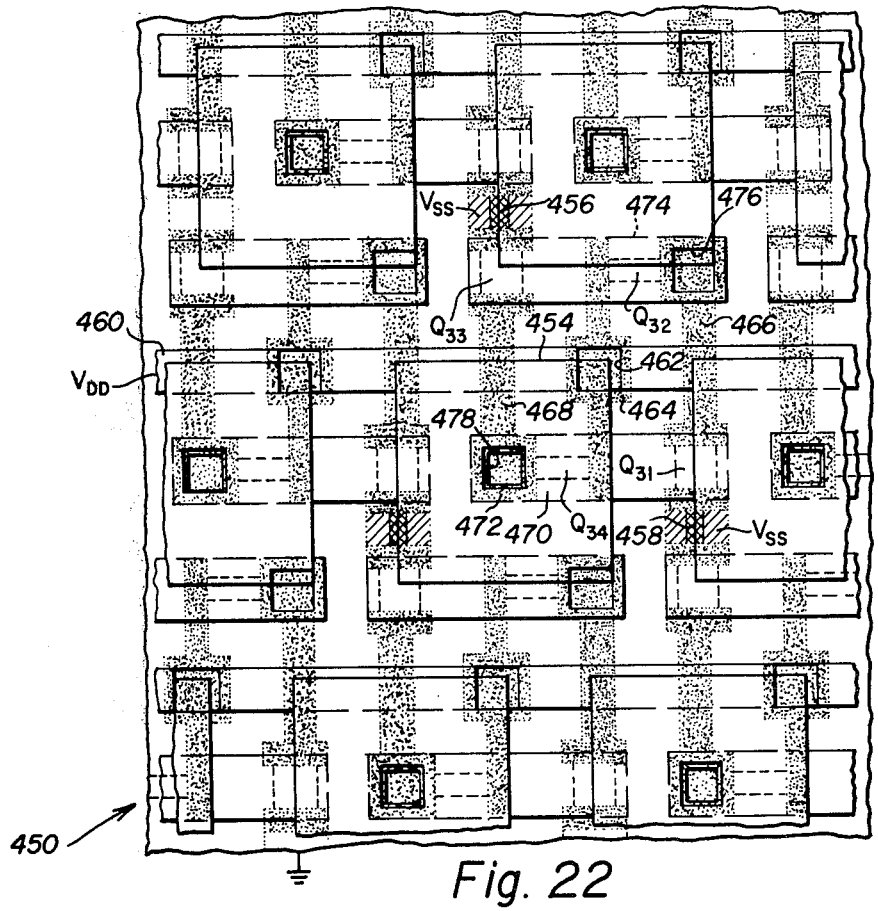
FIG. 22 is a plan view of a small portion of a high density imaging head of the type illustrated in FIG. 16 which can also be programmed by capacitive or resistive coupling.
Figure 23:
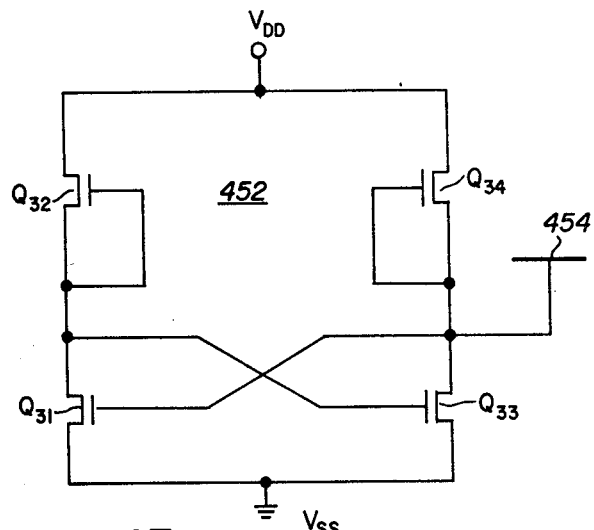
FIG. 23 is a schematic circuit diagram of one of the bistable circuits used in the imaging head of FIG. 22.

Still another imaging head in accordance with the present invention which is of the same type as that shown in FIG. 16 is indicated generally by the reference numeral 450 in FIG. 22. The head 450 utilizes the bistable circuit indicated generally by the reference numeral 452 in FIG. 23. The circuit 452 is identical in operation to the circuit illustrated in FIG. 420. However circuit 452 utilizes depletion load devices $Q_{32}$ and $Q_{34}$ which are considerably smaller in size than the enhancement mode load transistor used in circuit 421 of FIG. 21. The depletion load devices reduce the area by approximately 50% when compared to the circuit 420 utilizing enhancement mode load devices. Thus, the field plates 454 on the head 450 may be on 0.003 inch spacings, rather than 0.006 inch spacings. In operation, the circuit 452 is programmed by coupling a voltage, either capacitively or directly, to the field plate 454. A voltage having the same polarity as the drain supply voltage $V_{DD}$ switches transistor $Q_{31}$ on, turning transistor $Q_{33}$ off, and thus holding the drain supply voltage on the field plate 454, which may be considered the logic 1 state. A voltage applied to the field plate 454 approaching the substrate supply voltage $V_{SS}$ switches transistor $Q_{31}$ off, thus switching transistor $Q_{23}$ on and holding the field plate 454 at a voltage near the substrate supply voltage $V_{SS}$, which may be considered the logic 0 state.

Figure 28:
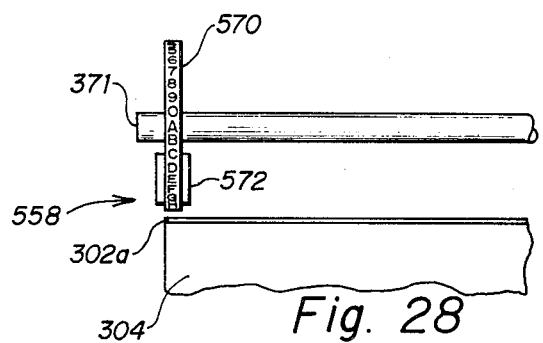
FIG. 28 is a schematic side view of the programming station of the system shown in FIG. 27.

The circuit 452 can be laid out as illustrated in FIG. 22. Reference characters are applied to only the components associated with a single bistable circuit 452 in FIG. 28 to facilitate tracing the circuit. However, the circuit is repeated for each field plate. The substrate is grounded and provides the $V_{SS}$ voltage through diffused regions 456 and 458 which are made by a heavily doped P-type region followed by a heavily doped N-type region. The drain supply voltage $V_{DD}$ is provided by conductor 460. The first stage of the circuit can then be traced from the drain supply voltage strip 460 through the opening 462 in the insulation to the diffused node 464, through transistor $Q_{32}$ to diffused node 466 and then to transistor $Q_{31}$ and then to the substrate contact 458. The second stage may be traced from diffused node 464, through transistor $Q_{34}$ to diffused node 468, then through transistor $Q_{33}$ and to substrate contact 456. Metallized strip 470 is connected to diffused node 468 through contact opening 472 in the first layer of insulation and forms the gates of transistors $Q_{34}$ and $Q_{31}$. Metallized strip 474 is connected to diffused node 466 through contact opening 476 in the first layer of insulation and provides the gate for transistors $Q_{32}$ and $Q_{33}$. The field plate 454 contacts the metallized strip 470 through opening 478 in the second layer of insulation.

Figure 24:
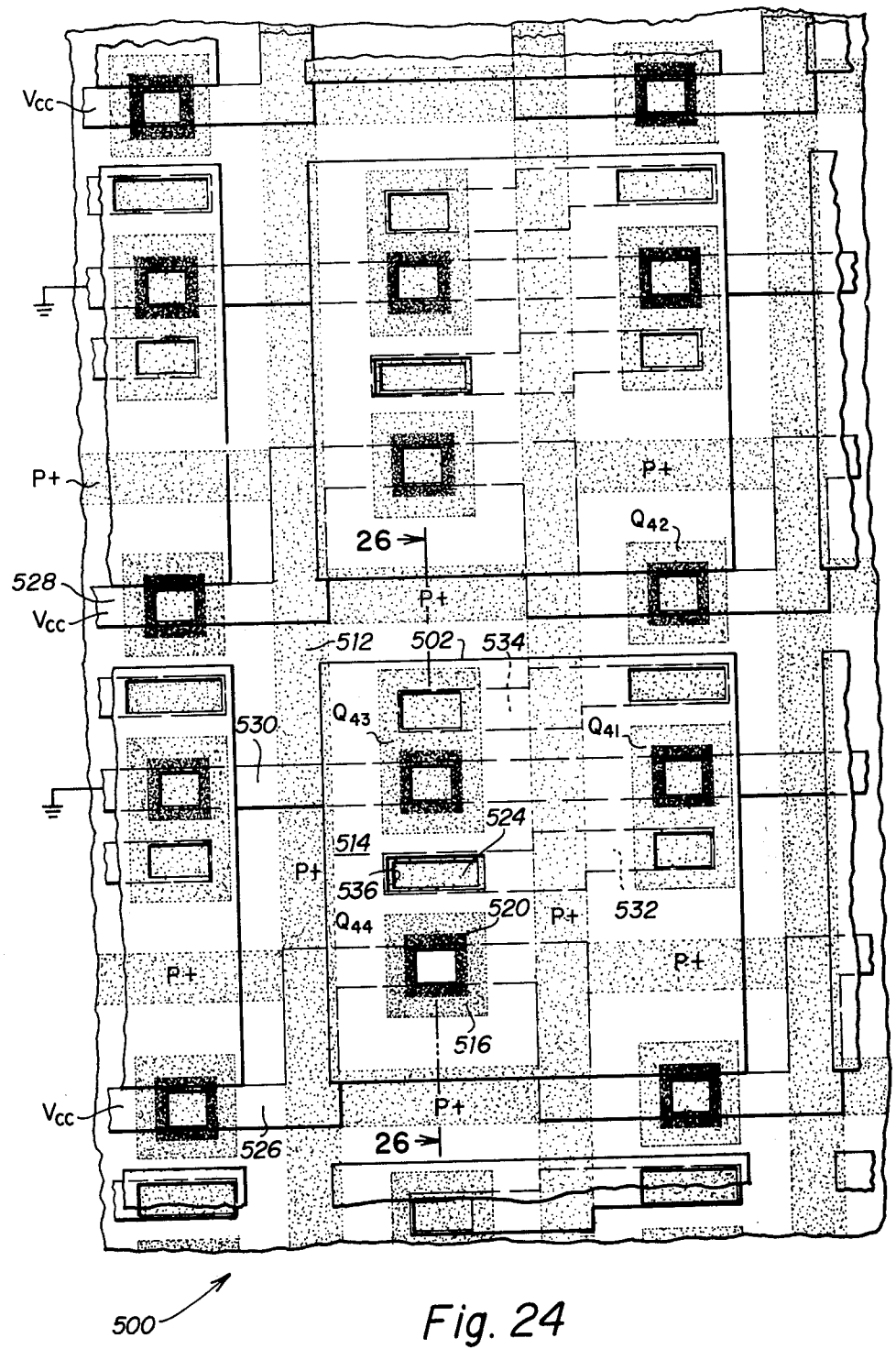
FIG. 24 is a plan view of a small portion of another high density imaging head of the type illustrated in FIG. 16 which can be programmed by capacitive or resistive coupling.
Figure 25:
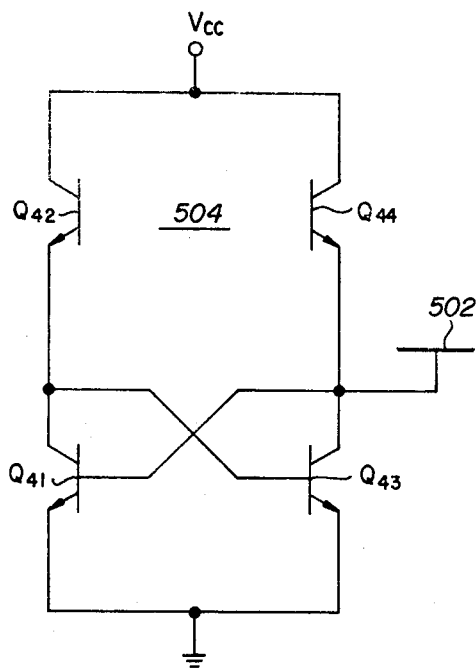
FIG. 25 is a schematic circuit diagram illustrating one of the bistable circuits used in the imaging head of FIG. 24.

Still another imaging head in accordance with the present invention is indicated generally by the reference numeral 500 in FIG. 24. The imaging head 500 utilizes a plurality of field plates 502. The voltage on each field plate 502 is controlled by a single bistable circuit indicated generally by the reference numeral 504 in FIG. 25. The bistable circuit 504 is formed by bipolar transistors $Q_{41} - Q_{44}$ connected in cross-coupled stages as illustrated. The load transistors $Q_{42}$ and $Q_{44}$ of the two stages are low gain transistors having open bases. Each bipolar circuit is again programmed by applying a voltage to the respective field plate 502, which is connected to the collector of switching transistor $Q_{43}$ of the second stage, by eight capacitive coupling, or resistive coupling. This voltage switches transistor $Q_{41}$ eight on or off to set the bistable circuit in the logic "1" state or the logic "0" state as heretofore described.

Figure 26:
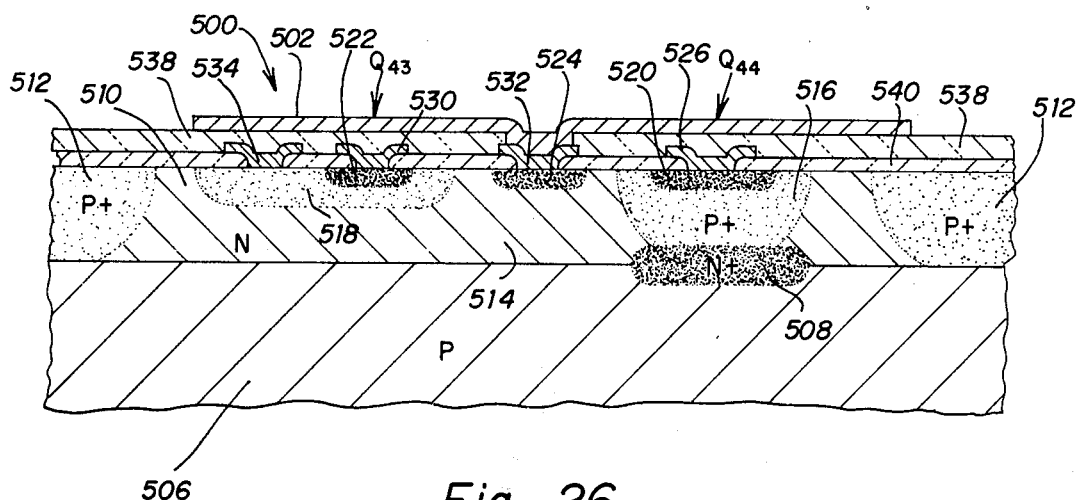
FIG. 26 is a sectional view taken substantially on line 26—26 of FIG. 24.

The bistable circuit 504 may be fabricated using conventional bipolar integrated circuit technology as illustrated in FIG. 24. FIG. 26 is a sectional view taken generally on lines 26–26 of FIG. 24. Each pair of transistors forming a stage of the bistable circuit is formed as best illustrated in FIG. 24. This circuit is formed by starting with a P-type substrate 506. A heavily doped N-type region 508 is first diffused into the substrate. Next, an N-type epitaxial region 510 is grown on the surface of the substrate 506. Heavily doped P-type regions 512 are then diffused to form isolated N-type regions 514 for each stage of the circuit. Simultaneously, a diffused region 516 may be made to form the base region of transistor $Q_{44}$. This diffusion makes contact with the N-type diffused region 508 to form a junction. Next, lightly doped p-type regions 518 is made to form the base of transistor $Q_{43}$. Finally, a heavily doped N-type diffusion is made to form region 522 which is the emitter region of transistor $Q_{43}$, region 524 which is the collector for transistor $Q_{43}$ and region 520 which is the collector of transistor $Q_{44}$.

As mentioned, the plan view of the diffused regions can be seen in FIG. 24. The collector supply voltage is provided by metalized conductors 526 and 528. Ground for the circuit is provided by metallized conductor 530. Metallized conductor 532 connects the base region of transistor $Q_{41}$ to the N-type region 514 which is the collector of the transistor $Q_{43}$. Similarly, a metallized strip 534 connects the base region of transistor $Q_{43}$ to the collector region of transistor $Q_{42}$. The field plate 502 is connected to the top of metallized strip 532 through opening 536 in a second insulating layer 538 which overlays the metallized strip. The first insulating layer 540 is disposed between the metallized strips and the substrate.

The imaging head 500 is programmed by capacitively or resistively coupling an electrode of the desired shape to the field plates and applying a voltage of the polarity to which the field plates are to be switched. This produces an electrostatic latent image which can be developed and printed as herein described.

Figure 27:
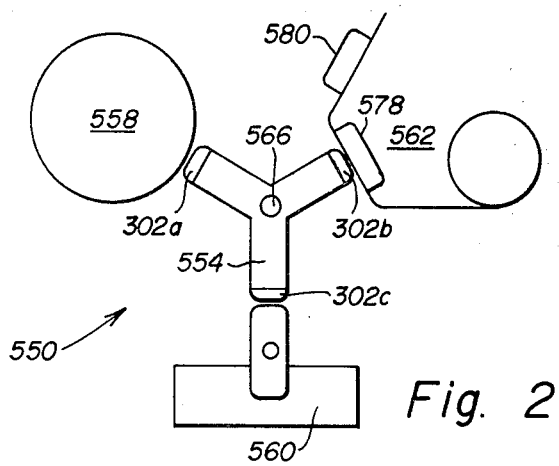
FIG. 27 is a schematic end view of a system in accordance with the present invention which may utilize imaging heads of the type shown in FIG. 16.
Figure 29:
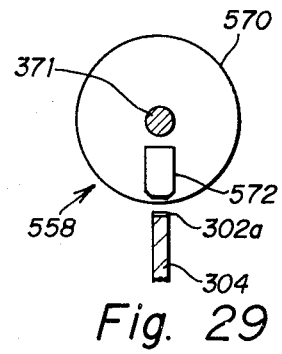
FIG. 29 is a schematic end view of the programming station illustrated in FIG. 28.

A line printer which may utilize any one of the specific embodiments 302, 420, 450, or 500 of the imaging head 300 of FIG. 16 is illustrated generally by the reference numeral 550 in FIG. 27. The line printer 550 includes three print heads 302a, 302b and 302c which are mounted on a common assembly 554. The assembly 554 is rotated about an axis 566 by a stepping motor (not illustrated) which sequentially positions the imaging heads 302a, 302b and 302c at a programming station 558, a developing station 560, and a printing station 562. The programming station 558 is shown in greater detail in FIGS. 28 and 29. The programming station 558 preferably comprises a drum 570 which is disposed adjacent the head 302a positioned at the programming station and rotates about an axis disposed parallel to the head. The drum 570 has a complete set of characters to be formed on the head. The characters are of the desired shape and are many times larger than the field plates 301 of the respective heads. For example, there might be from 20 to 30 field plates in the direction of the height of the character, and a corresponding number along the width. The characters are in the form of a font of transparent characters when the head 300 is the light programmed embodiment 303, and is a font of conductive characters when the level 300 is one of the capacitively or resistively programmed embodiments 420, 450, or 500.

A control unit 572 is positioned within the drum 570, as the drum 570 is rotated about shaft 571, the control unit 572 is energized as the appropriate character is positioned adjacent the head 302. For example, if the head is energized by light, the control unit 572 would flash a light through the desired character onto the head. This results in a light image of the desired character being projected onto the field plates so that the field plates illuminated by the light image will be charged to the drain supply voltage $V_{DD}$ as heretofore described. On the other hand, if the head 302a is capacitively or resistively programmed, a voltage pulse is applied to the characters on the drum as the appropriate character passes the head. Then the drum 570 is indexed one character to the right and the image of the appropriate character for that position programmed. This is repeated until the entire line of characters is completed. The mechanism 554 is then stepped until the head 302a is in position at the developing station 560. The developing stage 560 is illustrated as being of the magnetic brush type heretofore described and applies a toner to the head to develop the electrostatic latent image established by the charges on the field plates of the head 302a. Next, the head 302a is stepped to the print station 562 where the image is transferred to the paper 576 by a charge plate 578. The image is then fixed by a heater 580 in the conventional manner.

The printing system 550 provides a relatively high speed system for printing lines of characters such as that illustrated by the character "A" in FIG. 16 which are more readable and more pleasing to the eye than the matrix characters produced by the head 10. Yet the characters may be compiled by binary signals from a digital computer. If desired, a separate font and separately controlled light source or voltage source could be provided for each character positioned on the head 300.

Figure 30:
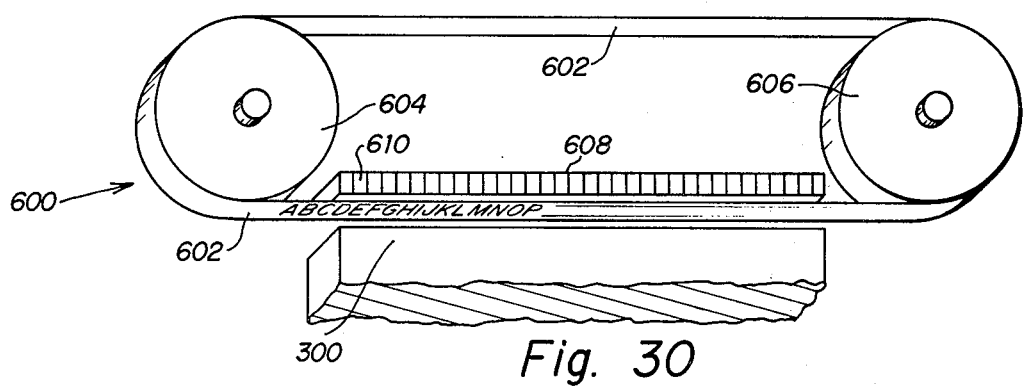
FIG. 30 is a schematic isometric view of an alternative programming station which may be used in the system illustrated in FIG. 27.
Figure 31:
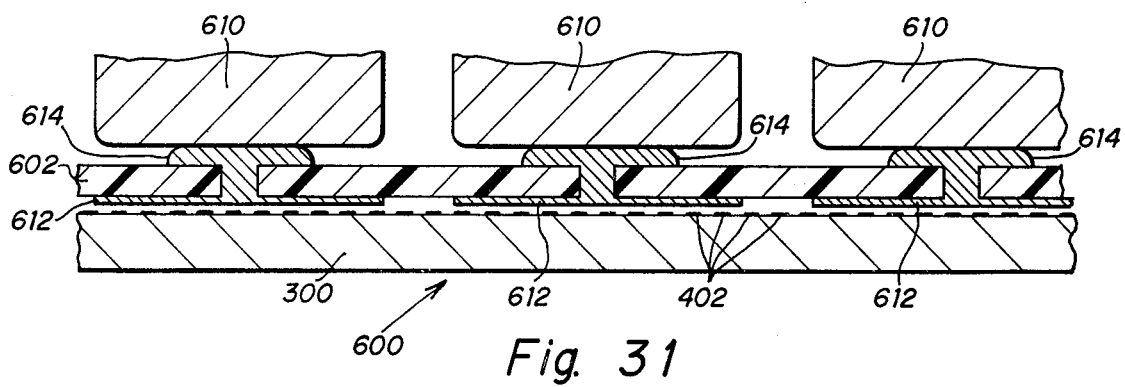
FIG. 31 is an enlarged sectional view of a portion of the programming station shown in FIG. 30.

Another apparatus from programming the high density heads 300 heretofore described is indicated generally by the reference numeral 600 in FIGS. 30 and 31. The system 600 is comprised of an endless non-conductive front tape 602 which carries a complete set of characters. The characters may be either conductive areas corresponding to the character when capacitive or direct resistive coupling is to be employed or transparent where optical coupling is employed. Of course the font may be negative of the characters if desired, in which case the logic of the print head would also be reversed. The conductive characters are illustrated in FIG. 31. The font travels around a pair of pulleys 604 and 606 and moves near the face of the head 300. A strobe unit 608 has a plurality of discretely controllable electrodes 610 which are located at each character position along the head 300. The electrodes 610 are best illustrated in FIG. 31. Each character 612 on the font strip has a contact plate 614 on the back surface which engages the electrodes 610 as the font moves along the row of electrodes. An electrical impulse is applied by the respective electrode 610 to the contact plate 614 of the appropriate character 612 while the character is in the proper position relative to the head 300. As a result, a complete line of characters can be composed on the head 300 with one pass of the font strip 602.

If the head 300 being used in the system 600 is programmed by light, the font 602 would have transparent characters and the electrode 610 would be replaced individually controllable light sources.

If desired, a suitable material may be placed between the conductive characters 612 and the field plates 301 to provide a conductive, but resistive path between the conductive characters 612 and the field plates 301. For example, the toner material used to develop the image may be continually brushed between the character 612 and the head 300 as the font is moved relative to the head. The chosen toner material may be conductive, but with a sufficient resistance to result in a relatively short effective conductive path in order to maintain the desired resolution.

Figure 32:
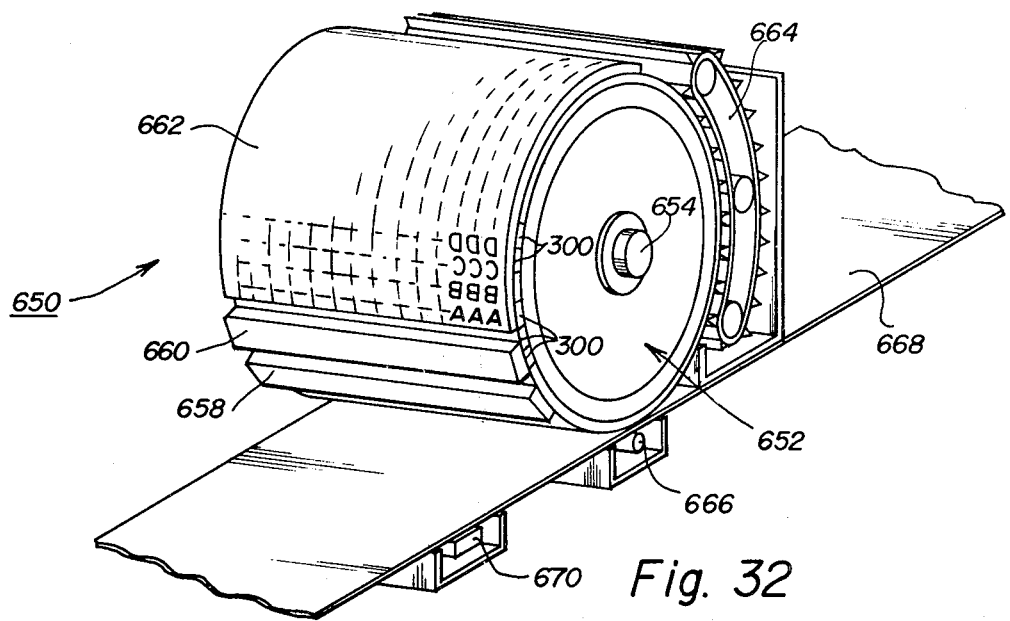
FIG. 32 is a simplified isometric of still another system in accordance with the present invention.

Still another system for utilizing heads of the type illustrated in FIG. 16 is indicated generally by the reference numeral 650 in FIG. 32. The system 650 includes a drum 652 which rotates about shaft 654. The entire periphery of the drum 650 has a surface formed by the heads 300, either capacitively programmed or light programmed. The heads 300 may provide a substantially continuous surface, or may be a series of heads spaced to provide the normal spacing between printed lines. The drum rotates in a clockwise direction as illustrated in the drawings. Each head 300 first passes a cleaning unit 658, then a resetting unit 660. Then the heads pass a programming cuff 662 before passing a conventional xerographic developing station 664. The developed image then passes a printing station 666 where the image is transferred to ordinary paper 668. The image on the paper then passes a fixing station 670 where the image is heated to fix the toner in the conventional manner.

The programming cuff 662 has a number of circumferentially extending character columns corresponding to the number of character positions on each of the character lines extending longitudinally along the circumference of the drum. Each circumferentially extending column of characters has a complete set of characters. Thus each character position on each line of the drum, i.e., head 300, passes each character of the set in the circumferentially extending columns each time the head is rotated past the cuff 662. The characters on the cuff 662 may be of the conductive type heretofore described where the surface of the drum is covered with capacitively programmed bistable circuits, or may be a transparent character where the drum uses light programmed bistable circuits. In the latter case, the character image may be produced by light emitting diodes of the desired shape.

Figure 33:
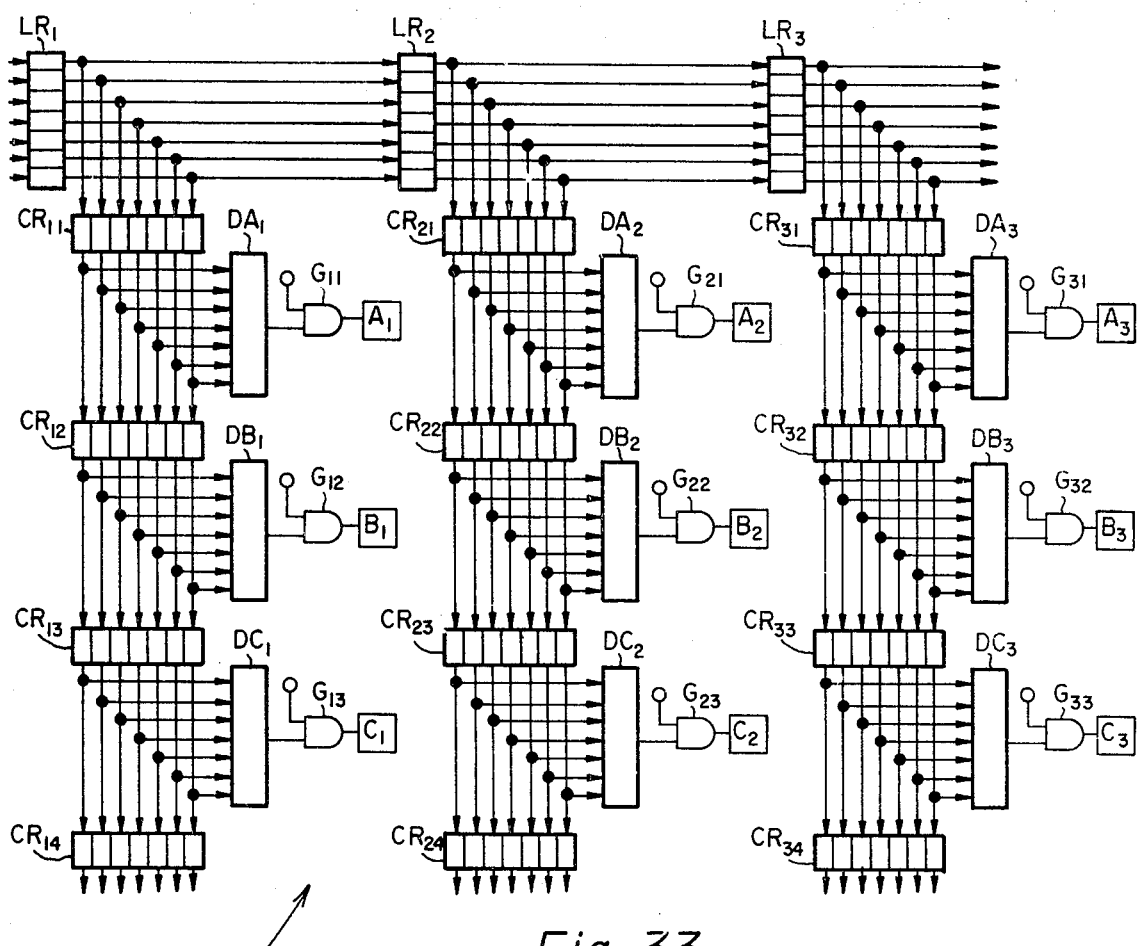
FIG. 33 is a schematic diagram of the programming logic for the system of FIG. 33.

The character positions on the cuff 662 are controlled by the circuit indicated generally by the reference numeral 680 in FIG. 33. The circuit 680 may conveniently comprise seven parallel shift registers. The corresponding bits of the shift register comprise a series of seven bit line registers, the number of line registers corresponding to the characters of the line extending from left to right.

The output at each line register is connected to a column of column registers, each corresponding to the number of characters in the set extending in the circumferential column of the cuff 662. For example, the output of the line register $LR_1$ is connected to the input of column register $CR_{11}$, which is the first in the series of column registers $CR_{12}$, $CR_{13}$ and $CR_{14}$. The outputs of the second line register $LR_2$ is similarly connected to a series of column registers $CR_{21}$, $CR_{22}$, $CR_{23}$ and $CR_{24}$, etc and the third line register $LR_3$ is connected to a series of registers $CR_{31}$, $CR_{32}$, $CR_{33}$, $CR_{34}$, etc.

The outputs of the first row of column registers $CR_{11}$, $CR_{21}$, and $CR_{31}$ are connected to decoders $DA_1$, $DA_2$, and $DA_3$, respectively, which produces an output when the character stored in respective column register is representative of the character "A". Similarly, the second row of column registers $CR_{12}$, $CR_{22}$ and $CR_{32}$ are connected to decoders $DB_1$, $DB_2$ and $DB_3$, which decode the character "B", and column registers $CR_{13}$, $CR_{23}$ and $CR_{33}$ are connected to decode registers $DC_1$, $DC_2$ and $DC_3$ which decode the character "C". The output from decoders $DA_1$–$DA_3$ are applied to gates $G_{11}$, $G_{21}$ and $G_{31}$ which energize characters $A_1$, $A_2$ and $A_3$, respectively, upon receiving a strobe pulse indicating that a particular line, i.e., head 300, on the periphery of the drum 652 is positioned adjacent the respective character of the cuff 662. Similarly, the output of decoders $DB_1$, $DB_2$, and $DB_3$ are connected to gates $G_{12}$, $G_{22}$ and $G_{32}$, which control characters $B_1$, $B_2$ and $B_3$, respectively, and decoders $DC_1$, $DC_2$ and $DC_3$ are connected to gates $G_{13}$, $G_{23}$ and $G_{33}$ which control characters $C_1$, $C_2$ and $C_3$.

In the operation of a system 650, a particular discrete line, or head 300, on the drum 652 first passes the cleaning station 658 where all residual toner is removed. Next, the drum passes the preset station 660 where all bistable circuits are preset to the logic 0 state. Just prior to the time that the head reaches the first row of characters $A_1$–$A_3$ on the programming cuff, the entire line of characters is entered into the line registers $LR_1$ –$LR_3$, etc., and thus into the first row of column registers $CR_{11}$, $CR_{21}$, $CR_{31}$, etc. This results in an output on the decoders $DA_1$, $DA_2$, $DA_3$, etc. at those character positions of the line where the character "A" is to be printed. When the line is in position adjacent the first row of characters $A_1$–$A_3$, the gates of the first row $G_{11}$, $G_{21}$ and $G_{31}$ are strobed so that the character "A" is programmed on the surface of the head in the character position when the character "A" was decoded. All of the data representing the characters in that line is then shifted from the first row of column registers $CR_{11}$, $CR_{21}$ and $CR_{31}$ to the second row $CR_{12}$, $CR_{22}$ and $CR_{32}$. The gates $G_{12}$, $G_{22}$ and $G_{32}$ are then strobed as the particular head 300 is positioned under the second row of characters $B_1$–$B_3$. The next succeeding line is shifted into the first row of column registers $CR_{11}$, $CR_{21}$ and $CR_{31}$ as the first row was shifted into the second row. Thus, as each successive line passes the row of characters on the cuff 662, the characters from that row are printed in the character position where that particular character is to be printed. Thus the entire line is composed after one pass of the drum and as a latent electrostatic image.

The latent image passes the developing station 664 where toner is cascaded over the surface of the drum to develop the image. The developed image is then transferred to the paper 668 and fixed at station 670.

Although several preferred embodiments of the invention have been described in detail, it is to be understood that various changes, substitutions and alternative combinations can be made therein without departing from the spirit and scope of the appended claims.

What is claimed is:

1. A system for producing an image of charged particles, comprising in combination:
   an imaging head having an array of discretely chargeable electrode areas positioned and charged to receive and attract in an image pattern particles charged opposite the charge on said chargeable electrode areas,
   individual circuit means associated with each discretely chargeable electrode area for selectively establishing at least one of two different electrical charges on the respective discretely chargeable electrode areas wherein the interconnections between said circuit means and said electrode areas are buried below the surface defined by said electrode areas so that an effective particle attracting field will be established only at said electrode areas and not by said circuit means,
   means for applying directly to the surface of said imaging head a uniformly distributed supply of charged particles which are attracted to the charges on the head to collect in accordance with a non-uniform image pattern for transfer therefrom in said non-uniform image pattern,
   means for transferring the particle image from the plates to a surface, and
   means for fixing the image on the surface.

2. The system of claim 1 wherein the discrete plates are arrayed to provide at least one character matrix.

3. The system of claim 1 wherein
   the plates are arrayed in a plurality of rows and columns to provide a line of character matrices, and
   the circuit means includes a plurality of shift registers, the electrical charge on each field plate being controlled by a bit of a shift register.

4. The system of claim 3 wherein there is a shift register for each row of plates and each plate is controlled by a bit of the shift register for the row in which the plate is located.

5. The system of claim 1 wherein
   the head is fixedly mounted,
   the means for applying toner to the plates is a magnetic member for transporting the particles past the print head, and
   the means for transferring the toner image to a surface includes means for positioning a sheet of paper adjacent the head after the toner has been transported past the head and for applying a potential to cause the toner to transfer from the head to the paper.

6. The system of claim 1 wherein the circuit means is formed as part of an integrated circuit and the electrostatic plates are formed at a surface of the integrated circuit.

7. The system of claim 6 wherein the electrostatic plates are formed by a plurality of semiconductor regions of one conductivity type separated one from the other by regions of the other conductivity type.

8. The system of claim 7 wherein the integrated circuit has two generally parallel faces and the electrostatic plates are disposed on one face and the circuit means is formed on the other face.

9. The system of claim 7 wherein the electrostatic plates are metallized areas on the integrated circuit.

10. The system of claim 1 wherein the circuit means comprises an individual circuit for controlling the state of each electrostatic plate and each individual means has two alternatively selectable stable states.

11. The system of claim 10 wherein at least a portion of the individual circuit means are interconnected to form a shift register in which the individual circuit means form stages of the shift register.

12. The system of claim 10 wherein the electrostatic plates are arrayed in at least one row, and the individual circuit means for the discretely chargeable plates in said at least one row are interconnected to form a shift register in which the individual circuit means form stages of the shift register.

13. The system of claim 12 wherein there are at least five rows of electrostatic plates to form matrix characters and at least five parallel shift registers, one for each row of discretely chargeable areas.

14. The system of claim 13 further characterized by circuit means for shifting binary data into the parallel shift registers representative of matrix characters.

15. The system of claim 1 wherein the electrostatic plates are arranged in sets, each set occupying an area of approximately the same size, each set including a plurality of discretely chargeable areas having different sizes one relative to the other.

16. The system of claim 15 wherein the electrostatic plates in each set have sizes in a binary progression.

17. The system of claim 15 wherein the circuit means is comprised of an individual circuit means for controlling each electrostatic plate and each individual circuit means has two stable states and are interconnected to form at least one shift register.

18. The system of claim 1 wherein the circuit means is comprised of an individual circuit means for controlling each electrostatic plate and at least a portion of the individual circuit means are controlled by light striking a light sensitive device.

19. The system of claim 18 wherein the light sensitive device and the electrostatic plate associated with the circuit controlled by the light sensitive device are formed in adjacent relationship on the same face of the head.

20. The system of claim 18 wherein the individual circuit means controlled by light comprise a bistable circuit means including the lifht sensitive device which is set to a first state in response to light striking the light sensitive devvice and is set to a second state by an electronic signal.

21. The system of claim 1 wherein the circuit means is comprised of an individual circuit means for controlling each electrostatic plate and each individual circuit means is a bistable circuit which can be set to at least one logic state in response to a voltage applied to the respective discretely chargeable area.

22. The system of claim 1 wherein the discrete electrostatic plates are formed on a semiconductor substrate and the circuit means are formed on the same semiconductor substrate.

23. The system for producing an image which comprises:
a head for holding an electrostatic image having a two dimensional array of discrete chargeable plates formed on the surface of a semiconductor substrate and each controlled by a separate bistable circuit formed in said semiconductor substrate,
means for moving the head to a programming station, a developing station, and a print station,
programming means at the programming station for establishing an electrostatic image on the head in response to electronic signals defining the image,
developing means at the developing station for transferring charged particles to the electrostatic image, and
print means at the print station for transferring the developed image of charged particles to a recording surface.

24. The system of claim 23 wherein the head is adapted to hold a line of characters, and
the programming means includes at least one font of characters which may be moved past at least one character position, and
means for selectively activating each character of the font as it is positioned adjacent the character position to set the bistable circuits associated with a selected set of plates defined by the character of the font to a predetermined stable state.

25. The system of claim 24 wherein the font is moved transversely of the line of characters on the head.

26. The system of claim 25 wherein a single font of characters is moved to at least a plurality of character positions on the head.

27. The system of claim 24 wherein the font is moved longitudinally of the line of characters on the head.

28. The system of claim 24 wherein
the bistable circuits are set to the predetermined state in response to light, and
the font means projects a light image of the selected characters onto the character positions on the head.

29. The system of claim 24 wherein
the bistable circuits are set to the predetermined state in response to a voltage coupled to the respective plate, and
the font produces a voltage image of the selected character at the respective character positions.

30. The system of claim 24 wherein
the programming means include at least one font of characters.
the head is successively moved past each character of the font and
a selected character is activated while the head is positioned adjacent the selected character.

31. The system of claim 30 wherein
the head has a line of character positions disposed transversely of the font.

32. The system of claim 31 wherein
there is a font for each character position on the line of characters.

33. The system of claim 23 wherein the bistable circuits are formed as part of an integrated circuit and the chargeable plates are formed at a surface of the integrated circuit.

34. The system of claim 33 wherein the chargeable plates are formed by a plurality of semiconductor regions of one conductivity type separated one from the other by regions of the other conductivity type.

35. The system of claim 34 wherein the integrated circuit has two generally parallel faces and the chargeable plates are disposed on one face and the bistable circuits are formed on the other face.

36. The system of claim 33 wherein the chargeable plates are metallized areas on the integrated circuit.

37. The system of claim 23 wherein each individual circuit means has two alternatively selectable stable states.

38. The system of claim 37 wherein at least a portion the bistable circuits are interconnected to form a shift register in which the bistable circuits form stages of the shift register.

39. The system of claim 37 wherein the chargeable plates are arrayed in at least one row, and the bistable circuits for the chargeable plates in said at least one row are interconnected to form a shift register.

40. The system of claim 39 wherein there are at least five rows of chargeable plates to form matrix characters and at least five parallel shift registers, one for each row of discretely chargeable areas.

41. The system of claim 40 further characterized by circuit means for shifting binary data into the parallel shift registers representative of matrix characters.

42. The system of claim 23 wherein the chargeable plates are arranged in sets, each set occupying an area of approximately the same size, each set including a plurality of discretely chargeable areas having different sizes one relative to the other.

43. The system of claim 42 wherein the discretely chargeable areas in each set have sizes in a binary progression.

44. The system of claim 42 wherein the individual circuit means have two stable plates and are interconnected to form at least one shift register.

45. The system of claim 23 wherein at least a portion of the bistable circuits are controlled by light striking a light sensitive device.

46. The system of claim 45 wherein the light sensitive device and the discretely chargeable areas associated with the bistable circuits controlled by the light sensitive device are formed in adjacent relationship on the same face of the imaging head.

47. The system of claim 45 wherein the bistable circuits controlled by light are set to a first state in response to light striking the respective light sensitive device and are set to a second state by an electronic signal.

48. The system of claim 23 wherein each bistable circuit can be set to at least one logic state in response to a voltage applied to the respective discretely chargeable area.

* * * * *

PO-1050
(5/69)

UNITED STATES PATENT OFFICE
CERTIFICATE OF CORRECTION

Patent No. 3,979,757   Dated Sept. 7, 1976

Inventor(s) Jack S. Kilby and Jay W. Lathrop

It is certified that error appears in the above-identified patent and that said Letters Patent are hereby corrected as shown below:

Col. 1, line 63, "heads" should be --head--.

Col. 5, line 40, "28" should be --24--.
Col. 8, line 39, "from" should be --form--.
Col. 16, line 14, "p-type" should be --P-type--.
Col. 17, line 66, before "individually" insert --by--.
Col. 19, line 15, "$B_3$." should be --$B_3$,--.
Col. 21, line 34, "devvice" should be --device--.

Signed and Sealed this

Fifteenth Day of March 1977

[SEAL]

Attest:

RUTH C. MASON
*Attesting Officer*

C. MARSHALL DANN
*Commissioner of Patents and Trademarks*